(12) United States Patent
Caron et al.

(10) Patent No.: US 12,063,026 B2
(45) Date of Patent: *Aug. 13, 2024

(54) LATERALLY EXCITED BULK WAVE DEVICE WITH ACOUSTIC MIRRORS

(71) Applicant: Skyworks Solutions, Inc., Irvine, CA (US)

(72) Inventors: Joshua James Caron, Summerfield, NC (US); Rei Goto, Osaka (JP)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/151,704

(22) Filed: Jan. 9, 2023

(65) Prior Publication Data

US 2023/0163746 A1 May 25, 2023

Related U.S. Application Data

(63) Continuation of application No. 17/105,351, filed on Nov. 25, 2020, now Pat. No. 11,552,614.

(Continued)

(51) Int. Cl.
*H03H 9/02* (2006.01)
*H03H 9/05* (2006.01)
(Continued)

(52) U.S. Cl.
CPC .... *H03H 9/02228* (2013.01); *H03H 9/02031* (2013.01); *H03H 9/02102* (2013.01);
(Continued)

(58) Field of Classification Search
CPC .... H03H 9/205; H03H 9/02031; H03H 9/132; H03H 9/58; H03H 9/02102;
(Continued)

(56) References Cited

U.S. PATENT DOCUMENTS 10,250,222 B2 4/2019 Kuroyanagi et al.
11,463,065 B2 10/2022 Goto
(Continued)

OTHER PUBLICATIONS

Plessky et al., "Laterally excited bulk wave resonators (XBARs) based on thin Lithium Niobate platelet for 5GHz and 13 GHz filters", IEEE/MTT-S International Microwave Symposium, pp. 512-515 (2019).
(Continued)

*Primary Examiner* — Rakesh B Patel
*Assistant Examiner* — Jorge L Salazar, Jr.
(74) *Attorney, Agent, or Firm* — Knobbe, Martens, Olson & Bear, LLP

(57) ABSTRACT

A laterally excited bulk acoustic wave device is disclosed. The laterally excited bulk acoustic wave device can include a first solid acoustic mirror, a second solid acoustic mirror, a piezoelectric layer that is positioned between the first solid acoustic mirror and the second solid acoustic mirror, an interdigital transducer electrode on the piezoelectric layer, and a support substrate arranged to dissipate heat associated with the bulk acoustic wave. The interdigital transducer electrode is arranged to laterally excite a bulk acoustic wave. The first solid acoustic mirror and the second solid acoustic mirror are arranged to confine acoustic energy of the bulk acoustic wave. The first solid acoustic mirror is positioned on the support substrate.

20 Claims, 33 Drawing Sheets

Related U.S. Application Data

(60) Provisional application No. 62/943,092, filed on Dec. 3, 2019.

(51) Int. Cl.
  *H03H 9/13* (2006.01)
  *H03H 9/205* (2006.01)
  *H03H 9/58* (2006.01)

(52) U.S. Cl.
  CPC .......... *H03H 9/0561* (2013.01); *H03H 9/132* (2013.01); *H03H 9/205* (2013.01); *H03H 9/58* (2013.01)

(58) Field of Classification Search
  CPC .... H03H 9/0514; H03H 9/0561; H03H 9/175; H03H 9/564; H03H 9/02228
  USPC .......................................... 333/133, 193–196
  See application file for complete search history.

(56) References Cited

U.S. PATENT DOCUMENTS

| 11,552,614 | B2* | 1/2023 | Caron ............... H03H 9/02102 |
|---|---|---|---|
| 2016/0182009 | A1 | 6/2016 | Bhattacharjee |
| 2017/0366163 | A1 | 12/2017 | Kishimoto |
| 2018/0287587 | A1 | 10/2018 | Campanella Pineda et al. |
| 2019/0386637 | A1 | 12/2019 | Plesski et al. |
| 2020/0028487 | A1 | 1/2020 | Caron |
| 2020/0083860 | A1 | 3/2020 | Ylilammi et al. |
| 2021/0119602 | A1 | 4/2021 | Lu et al. |
| 2021/0167752 | A1 | 6/2021 | Caron et al. |
| 2021/0167753 | A1 | 6/2021 | Goto |
| 2022/0321088 | A1 | 10/2022 | Goto et al. |
| 2022/0321096 | A1 | 10/2022 | Goto et al. |
| 2023/0108686 | A1 | 4/2023 | Fukuhara et al. |
| 2023/0111476 | A1 | 4/2023 | Fukuhara et al. |
| 2023/0121844 | A1 | 4/2023 | Goto |
| 2023/0163746 | A1 | 5/2023 | Caron et al. |

OTHER PUBLICATIONS

Written Opinion in application No. 10202012082V, dated Sep. 15, 2023.

Yen et al., "Integrated High-performance Clocking Solutions Utilizing Mirror-encapsulated BAW Resonators", Program Digest, 2019 IEEE International Ultrasonics Symposium (IUS), Glasgow, Scotland (Oct. 6-9, 2019).

* cited by examiner

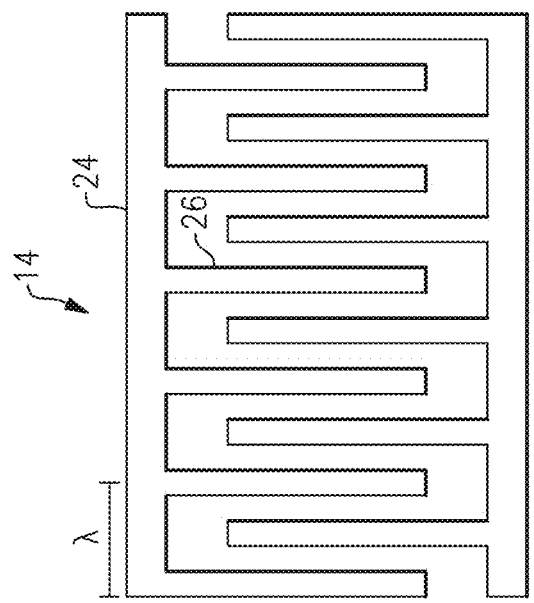
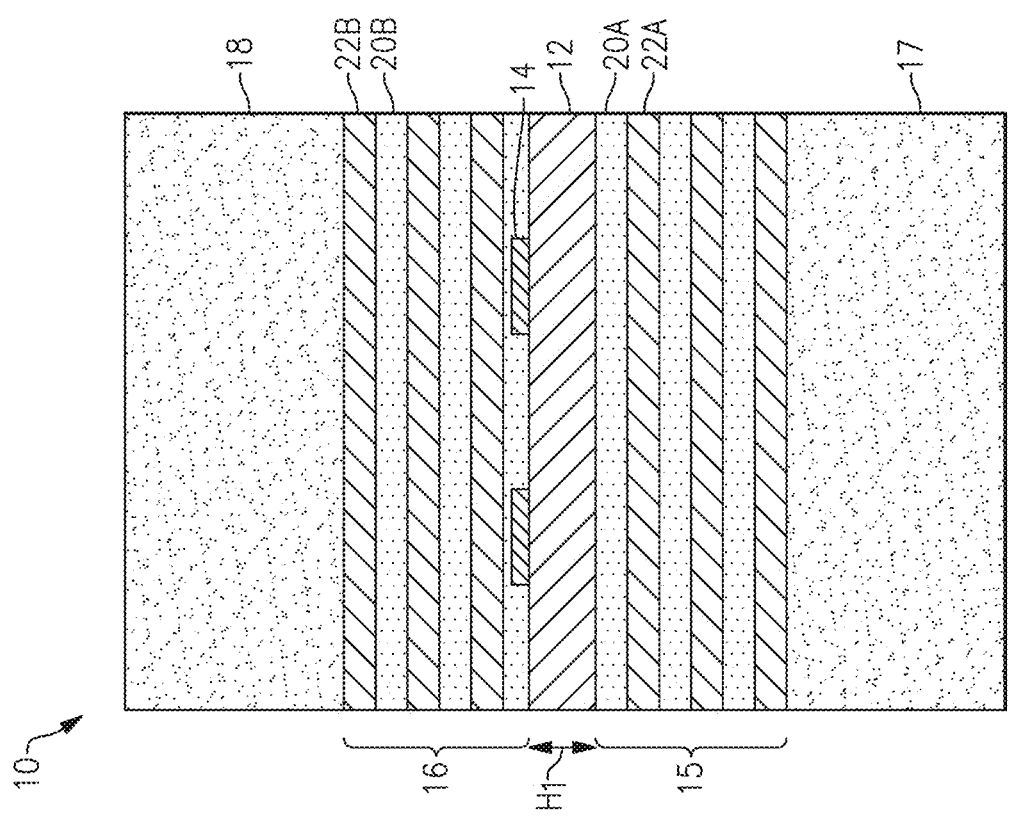

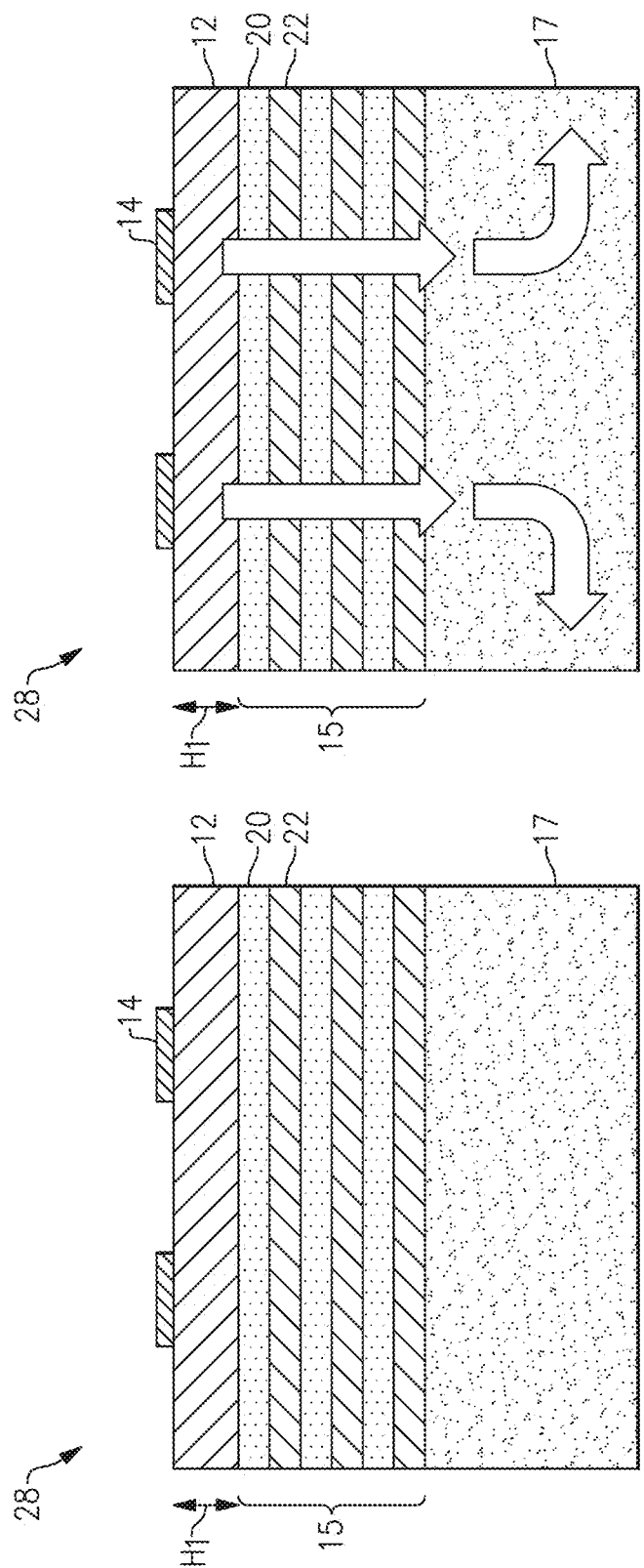

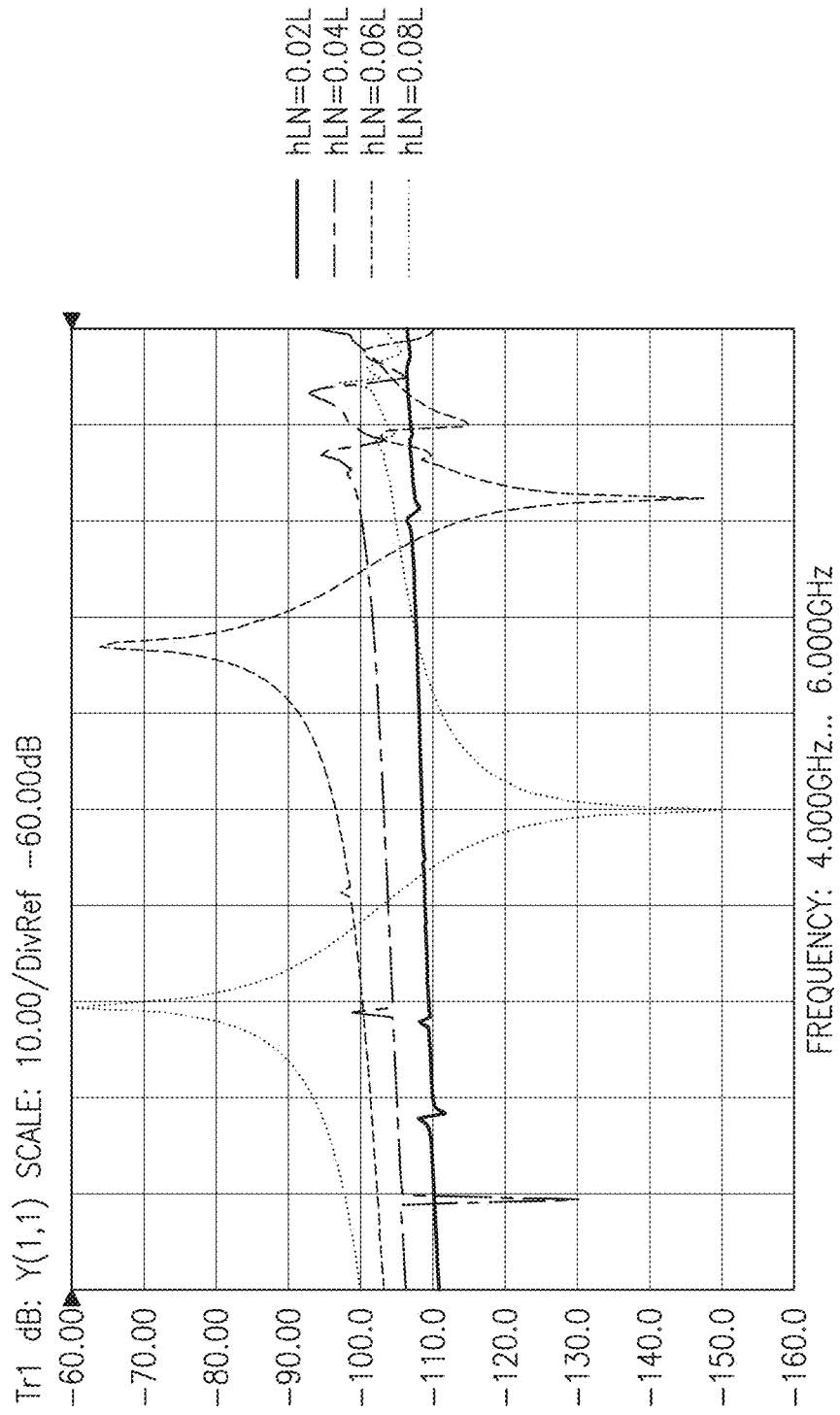

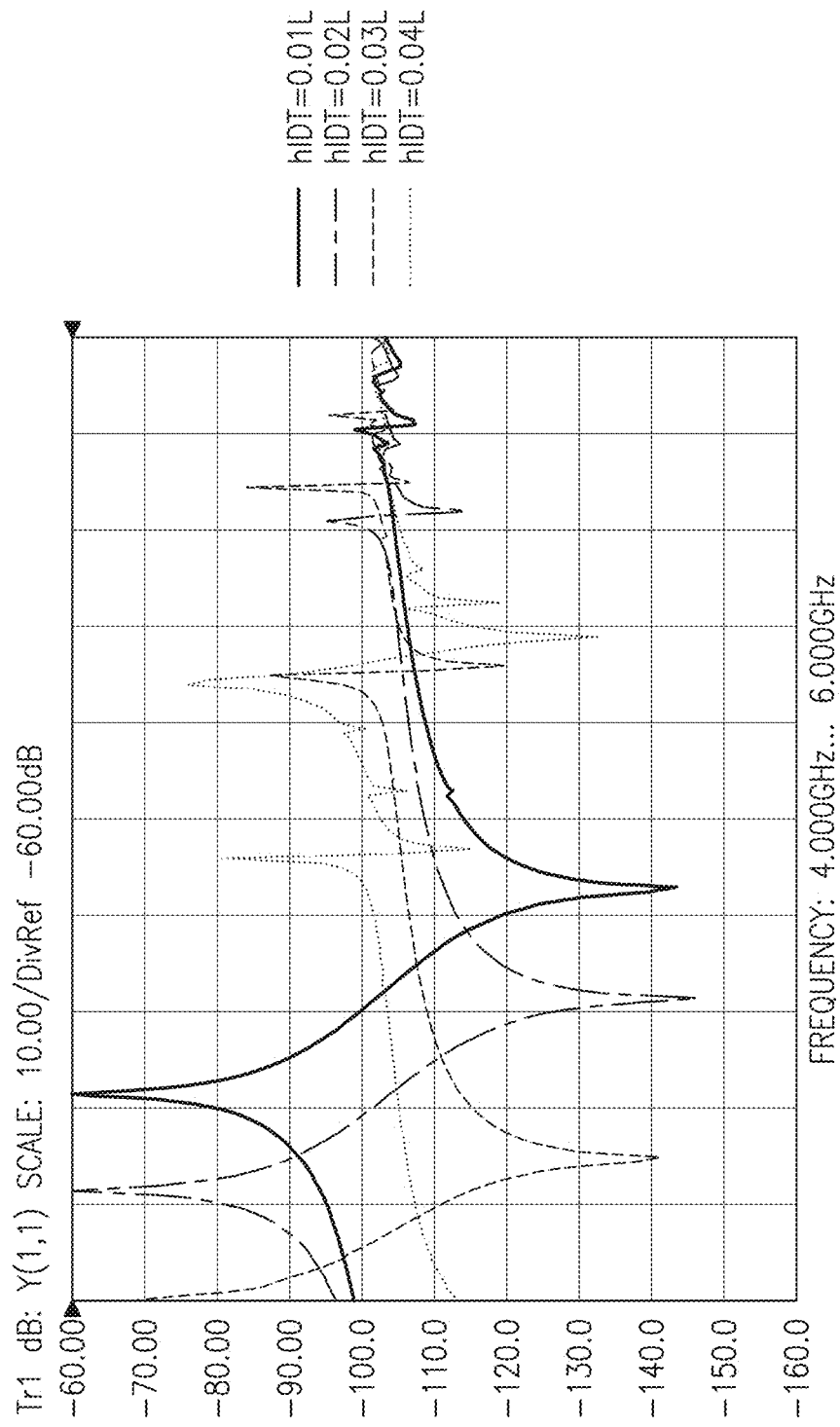

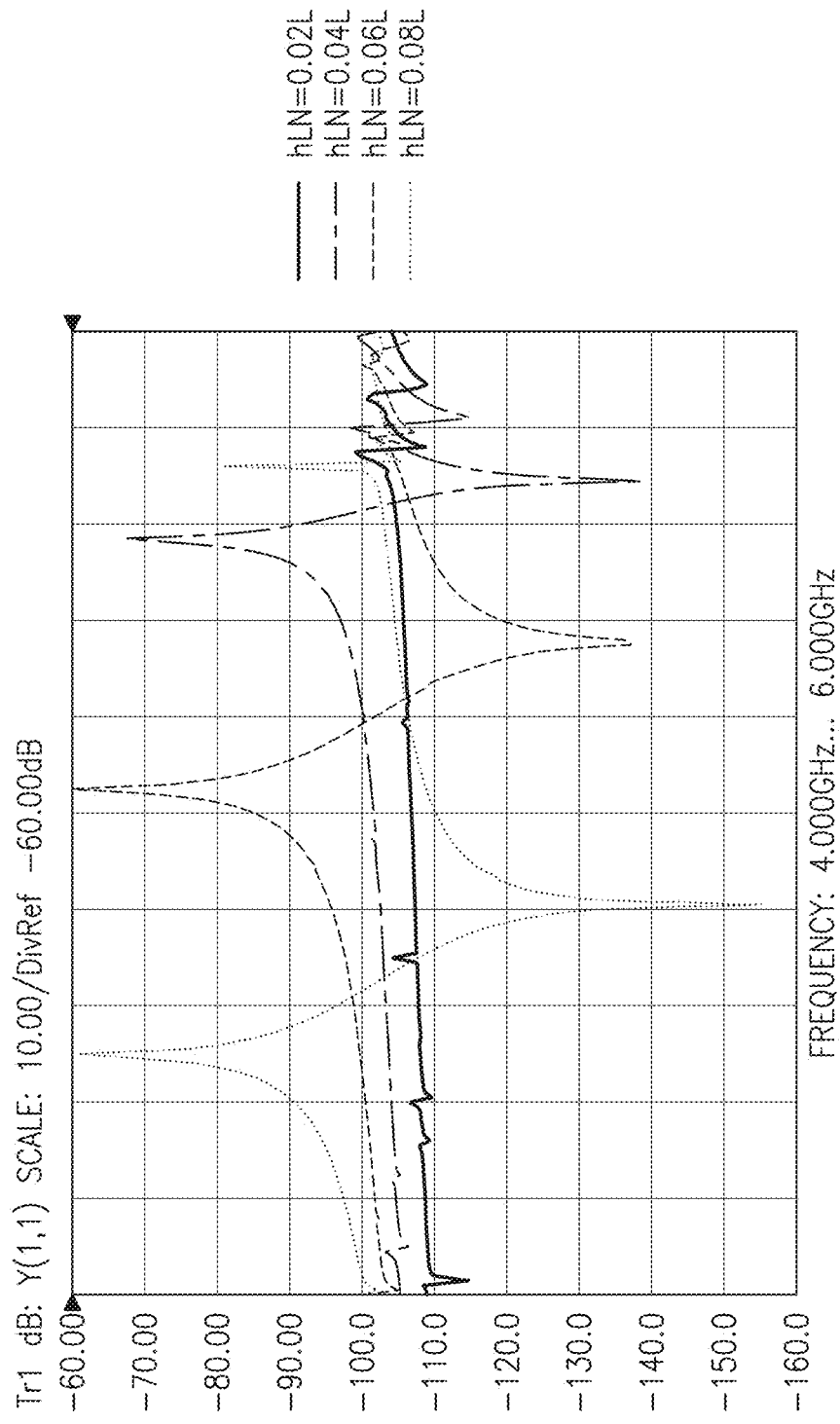

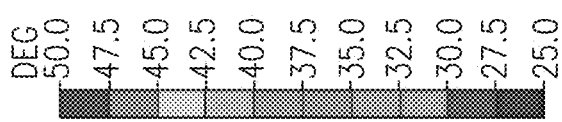
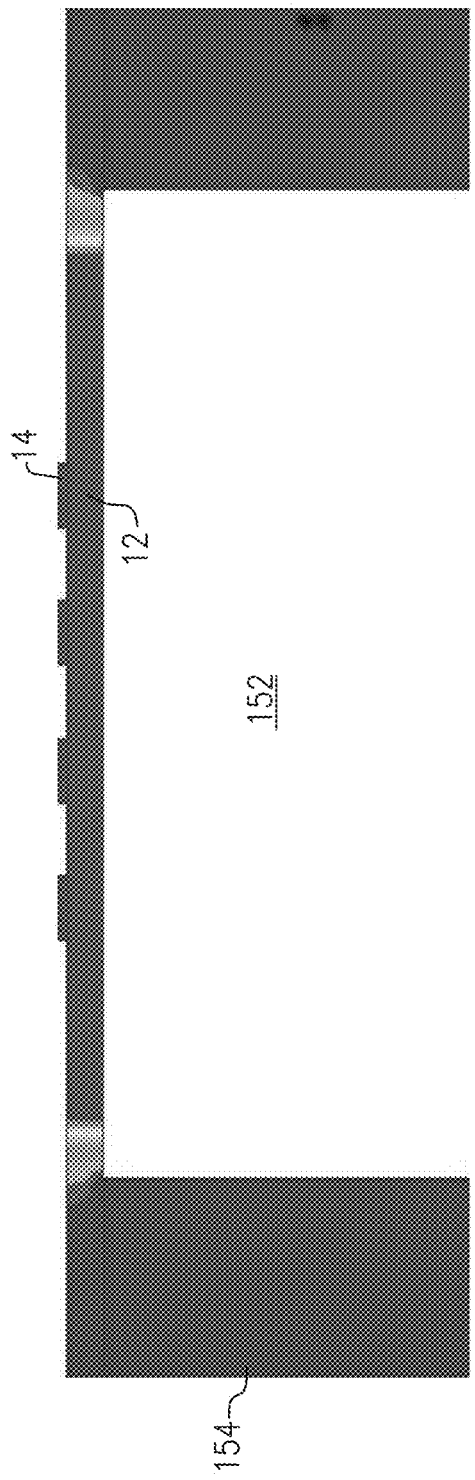
FIG.15
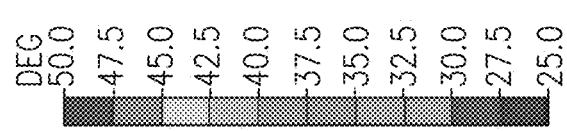
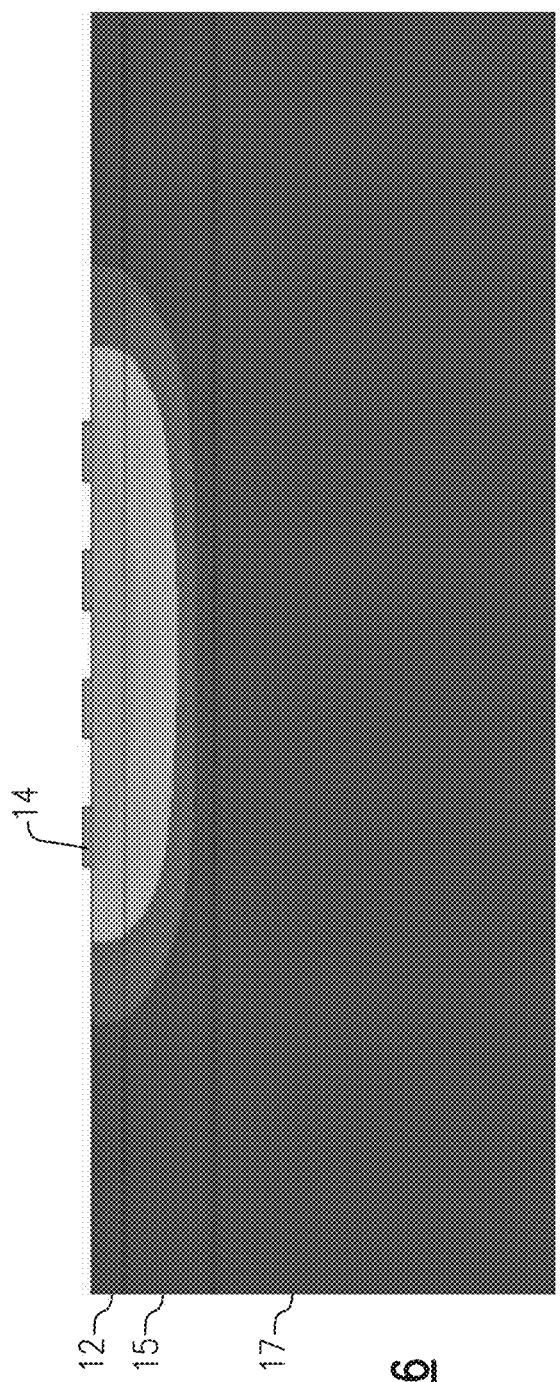
FIG.16

LATERALLY EXCITED BULK WAVE DEVICE WITH ACOUSTIC MIRRORS

INCORPORATION BY REFERENCE TO ANY PRIORITY APPLICATIONS

Any and all applications for which a foreign or domestic priority claim is identified in the Application Data Sheet as filed with the present application, including U.S. Provisional Patent Application No. 62/943,092, filed Dec. 3, 2019, titled "LATERALLY EXCITED BULK WAVE DEVICE WITH ACOUSTIC MIRRORS," are hereby incorporated by reference under 37 CFR 1.57 in their entirety.

BACKGROUND

Technical Field

Embodiments of this disclosure relate to acoustic wave devices.

Description of Related Technology

An acoustic wave filter can include a plurality of resonators arranged to filter a radio frequency signal. Example acoustic wave filters include surface acoustic wave (SAW) filters and bulk acoustic wave (BAW) filters. A surface acoustic wave resonator can include an interdigital transductor electrode on a piezoelectric substrate. The surface acoustic wave resonator can generate a surface acoustic wave on a surface of the piezoelectric layer on which the interdigital transductor electrode is disposed. In BAW resonators, acoustic waves propagate in a bulk of a piezoelectric layer. Example BAW resonators include film bulk acoustic wave resonators (FBARs) and solidly mounted resonators (SMRs). Certain acoustic resonators can include features of SAW resonators and features of BAW resonators.

Acoustic wave filters can be implemented in radio frequency electronic systems. For instance, filters in a radio frequency front end of a mobile phone can include acoustic wave filters. An acoustic wave filter can be a band pass filter. A plurality of acoustic wave filters can be arranged as a multiplexer. For example, two acoustic wave filters can be arranged as a duplexer. As another example, four acoustic wave filters can be arranged as a quadplexer.

SUMMARY

The innovations described in the claims each have several aspects, no single one of which is solely responsible for its desirable attributes. Without limiting the scope of the claims, some prominent features of this disclosure will now be briefly described.

In one embodiment, a laterally excited bulk acoustic wave device is disclosed. The laterally excited bulk acoustic wave device can include a first solid acoustic mirror, a second solid acoustic mirror, a piezoelectric layer positioned between the first solid acoustic mirror and the second solid acoustic mirror, an interdigital transducer electrode on the piezoelectric layer, and a support substrate arranged to dissipate heat associated with the bulk acoustic wave. The interdigital transducer electrode is arranged to laterally excite a bulk acoustic wave. The first solid acoustic mirror and the second solid acoustic mirror are arranged to confine acoustic energy of the bulk acoustic wave. The first solid acoustic mirror is positioned on the support substrate.

In one embodiment, the laterally excited bulk acoustic wave device further includes a second substrate that is configured to dissipate heat associated with the bulk acoustic wave. The first solid acoustic mirror and the second solid acoustic mirror both can be positioned between the support substrate and the second substrate.

In one embodiment, the first solid acoustic mirror is arranged to confine acoustic energy such that the support substrate is free from acoustic energy during operation of the laterally excited bulk acoustic wave device.

In one embodiment, the first solid acoustic mirror is an acoustic Bragg reflector that includes alternating low impedance and high impedance layers. At least one of the low impedance layers and at least one of the high impedance layers can be free from acoustic energy during operation of the laterally excited bulk acoustic wave device. The high impedance layers can each have a thickness in a range from about $0.14\lambda_p$ to $0.30\lambda_p$ or from about $0.35\lambda_p$ to $0.45\lambda_p$, in which $\lambda_p$ is a wave length of longitudinal wave velocity.

In one embodiment, the support substrate is a silicon substrate.

In one embodiment, the piezoelectric layer has a thickness in a range from 0.2 micrometers to 0.4 micrometers.

In one embodiment, the piezoelectric layer has a thickness in a range from 0.2 micrometers to 0.3 micrometers.

In one embodiment, the piezoelectric layer is an aluminum nitride layer.

In one embodiment, the piezoelectric layer is a lithium niobate layer.

In one embodiment, the piezoelectric layer is a lithium tantalate layer.

In one embodiment, the laterally exited bulk acoustic wave device has a resonant frequency in a range from 4.5 gigahertz to 10 gigahertz.

In one embodiment, the laterally exited bulk acoustic wave device has a resonant frequency in a range from 5 gigahertz to 10 gigahertz.

In one embodiment, the laterally exited bulk acoustic wave device has a resonant frequency in a range from 10 gigahertz to 25 gigahertz.

In one embodiment, the laterally excited bulk acoustic wave device has a resonant frequency in a range from 3 gigahertz to 5 gigahertz.

In one aspect, a laterally excited bulk acoustic wave device is disclosed. The laterally excited bulk acoustic wave device can include a piezoelectric layer and an interdigital transducer electrode on the piezoelectric layer. The interdigital transducer electrode is configured to laterally excite a bulk acoustic wave. The laterally excited bulk acoustic wave device can also include a pair of solid acoustic mirrors on opposing sides of the piezoelectric layer. The pair of solid acoustic mirrors are configured to confine acoustic energy of the bulk acoustic wave. The laterally excited bulk acoustic wave device can further include a support substrate. One solid acoustic mirror of the pair of solid acoustic mirrors is positions between the support substrate and the piezoelectric layer.

In one embodiment, the laterally excited bulk acoustic wave device further includes one or more suitable features disclosed herein.

In one aspect, a laterally excited bulk acoustic wave component is disclosed. The laterally excited bulk acoustic wave component can include a first substrate, a first solid acoustic mirror on the first substrate, a piezoelectric layer on the first solid acoustic mirror, and an interdigital transducer electrode on the piezoelectric layer. The interdigital transducer electrode that is arranged to laterally excite a bulk acoustic wave. The laterally excited bulk acoustic wave component can also include a second solid acoustic mirror on the piezoelectric layer and the interdigital transducer electrode. The first solid acoustic mirror and the second solid acoustic mirror are together arranged to confine acoustic energy of the bulk acoustic wave. The laterally excited bulk acoustic wave component can further include a second substrate on the second solid acoustic mirror. The first and second solid acoustic mirrors are positioned between the first and second substrates. The first and second substrates are arranged to dissipate heat associated with the bulk acoustic wave.

In one embodiment, the laterally excited bulk acoustic wave component further includes a conductive via extending through the second substrate. The conductive via can be electrically connected to a laterally excited bulk acoustic wave resonator that includes the interdigital transducer electrode. The laterally excited bulk acoustic wave component can further include an input/output contact that is electrically connected to the conductive via.

In one embodiment, the laterally excited bulk acoustic wave component further includes a third solid acoustic mirror on the second substrate, a second piezoelectric layer on the third solid acoustic mirror, and a second interdigital transducer electrode on the second piezoelectric layer. The laterally excited bulk acoustic wave component can further include an adhesion layer positioned between the second substrate and the third solid acoustic mirror. The laterally excited bulk acoustic wave component can further include a fourth solid acoustic mirror over the second piezoelectric layer. The laterally excited bulk acoustic wave component can further include a third substrate over the fourth solid acoustic mirror. The laterally excited bulk acoustic wave component can further include a third substrate over the second interdigital transducer electrode.

In one embodiment, the laterally excited bulk acoustic wave component further includes circuitry on the second substrate. The circuitry can include a transistor. The circuitry can include a passive impedance element. The circuitry can include an acoustic wave device.

In one embodiment, the second substrate is a silicon substrate.

In one embodiment, the laterally excited bulk acoustic wave component can further include one or more suitable features disclosed herein.

In one aspect, a stacked acoustic wave device assembly is disclosed. The stacked acoustic wave device assembly can include a first support substrate and a first laterally excited bulk acoustic wave stack on the first support substrate. The first laterally excited bulk acoustic wave stack includes a first piezoelectric layer, a first interdigital transducer electrode on the first piezoelectric layer, and a pair of solid acoustic mirrors on opposing sides of the first piezoelectric layer. The stacked acoustic wave device assembly can further include a second support substrate positioned on the first laterally excited bulk acoustic wave stack, and a second laterally excited bulk acoustic wave stack on the second support substrate. The second laterally excited bulk acoustic wave stack includes a second piezoelectric layer, a second interdigital transducer electrode on the second piezoelectric layer, and a solid acoustic mirror positioned between the second piezoelectric layer and the second support substrate.

In one embodiment, the solid acoustic mirror is included in a second pair of solid acoustic mirrors. The second pair of solid acoustic mirrors can be on opposing sides of the second piezoelectric layer.

In one embodiment, the stacked acoustic wave device assembly further includes a third substrate over the second laterally excited bulk acoustic wave stack.

In one embodiment, the stacked acoustic wave device assembly further include an adhesion layer positioned between the second support substrate and the solid acoustic mirror.

In one embodiment, the first laterally excited bulk acoustic wave stack and the second laterally excited bulk acoustic wave stack are included in a single acoustic wave filter arranged to filter a radio frequency signal.

In one embodiment, the first laterally excited bulk acoustic wave stack and the second laterally excited bulk acoustic wave stack are included in different acoustic wave filters. The different acoustic wave filters can be included in a multiplexer.

In one embodiment, the first piezoelectric layer has a thickness in a range from 0.2 micrometers to 0.4 micrometers.

In one embodiment, the first piezoelectric layer has a thickness in a range from 0.2 micrometers to 0.3 micrometers.

In one embodiment, the laterally exited bulk acoustic wave stack is included in a resonator having a resonant frequency in a range from 4.5 gigahertz to 10 gigahertz.

In one embodiment, the laterally exited bulk acoustic wave stack is included in a resonator having a resonant frequency in a range from 5 gigahertz to 10 gigahertz. The laterally exited bulk acoustic wave stack included in a resonator can have a resonant frequency in a range from 10 gigahertz to 25 gigahertz.

In one embodiment, the stacked acoustic wave device assembly further includes one or more suitable features disclosed herein.

In one aspect, an acoustic wave filter is disclosed. The acoustic wave filter can include a laterally excited bulk acoustic wave resonator that includes a first solid acoustic mirror on a first substrate, a piezoelectric layer on the first solid acoustic mirror, an interdigital transducer electrode on the piezoelectric layer, and a second solid acoustic mirror on the piezoelectric layer and the interdigital transducer electrode. The acoustic wave filter can also include a plurality of acoustic wave resonators. The laterally excited bulk acoustic wave resonator and the plurality of acoustic wave resonators are together configured to filter a radio frequency signal.

In one embodiment, the acoustic wave filter is a band pass filter.

In one embodiment, the plurality of acoustic wave resonators include a second laterally excited bulk acoustic wave resonator. The second laterally excited bulk acoustic wave resonator can include a third solid acoustic mirror on a second substrate, a second piezoelectric layer on the third solid acoustic mirror, and a second interdigital transducer electrode on the second piezoelectric layer. The second laterally excited bulk acoustic wave resonator can further include a fourth solid acoustic mirror on the second piezoelectric layer and the second interdigital transducer electrode. The second substrate can be positioned between the second solid acoustic mirror and the third solid acoustic mirror. An adhesion layer can be positioned between the second substrate and the third solid acoustic mirror.

In one embodiment, the laterally excited bulk acoustic wave resonator has a resonant frequency in a range from 4.5 gigahertz to 10 gigahertz.

In one embodiment, the laterally excited bulk acoustic wave resonator has a resonant frequency in a range from 5 gigahertz to 10 gigahertz.

In one embodiment, the laterally excited bulk acoustic wave resonator has a resonant frequency in a range from 10 gigahertz to 25 gigahertz.

In one embodiment, the piezoelectric layer has a thickness in a range from 0.2 micrometers to 0.4 micrometers.

In one embodiment, the piezoelectric layer has a thickness in a range from 0.2 micrometers to 0.3 micrometers.

In one embodiment, the acoustic wave filter further includes one or more suitable features disclosed herein.

In one aspect, a radio frequency module is disclosed. The radio frequency module can include any acoustic wave filter disclosed herein and a radio frequency circuit element that is coupled to the acoustic wave filter. The acoustic wave filter and the radio frequency circuit element can be enclosed within a common package.

In one embodiment, the radio frequency circuit element is a radio frequency amplifier arranged to amplify a radio frequency signal. The radio frequency amplifier can be a low noise amplifier. The radio frequency amplifier can be a power amplifier. The radio frequency module can further includes a switch that is configured to selectively couple a terminal of the acoustic wave filter to an antenna port of the radio frequency module.

In one embodiment, the radio frequency circuit element is a switch that is configured to selectively couple the acoustic wave filter to an antenna port of the radio frequency module.

In one aspect, a wireless communication device is disclosed. The wireless communication device can include an acoustic wave filter disclosed herein, an antenna that is operatively coupled to the acoustic wave filter, a radio frequency amplifier that is operatively coupled to the acoustic wave filter and configured to amplify a radio frequency signal, and a transceiver that is in communication with the radio frequency amplifier.

In one embodiment, the wireless communication device further includes a baseband processor that is in communication with the transceiver.

In one embodiment, the acoustic wave filter is included in a radio frequency front end.

In one embodiment, the acoustic wave filter is included in a diversity receive module.

In one aspect, a method of filtering a radio frequency signal is disclosed. The method can include receiving a radio frequency signal at a port of an acoustic wave filter disclosed herein, and filtering the radio frequency signal with the acoustic wave filter.

BRIEF DESCRIPTION OF THE DRAWINGS

Embodiments of this disclosure will now be described, by way of non-limiting example, with reference to the accompanying drawings.

FIG. 1A is cross sectional diagram of a laterally excited bulk acoustic wave device according to an embodiment.

FIG. 1B is a plan view of an interdigital transducer (IDT) electrode of the laterally excited bulk acoustic wave device of FIG. 1A.

FIG. 2A is a cross sectional diagram of a laterally excited bulk acoustic wave device with a solid acoustic mirror according to an embodiment.

FIG. 2B is a cross sectional view showing heat flow in the laterally excited bulk acoustic wave device of FIG. 2A.

FIG. 10D is a graph corresponding to different thicknesses of the piezoelectric layer for the laterally excited bulk acoustic wave device of FIG. 9.

FIG. 10G is a graph corresponding to different thicknesses of the interdigital transducer electrode for the laterally excited bulk acoustic wave device of FIG. 10F.

FIG. 12D is a graph corresponding to different thicknesses of the piezoelectric layer for the laterally excited bulk acoustic wave device of FIG. 11A.

FIG. 15 illustrates a thermal simulation result of a laterally excited bulk acoustic wave device with a membrane structure.

FIG. 16 illustrates a thermal simulation result of a laterally excited bulk acoustic wave device with a single solid acoustic mirror structure according to an embodiment.

DETAILED DESCRIPTION OF CERTAIN EMBODIMENTS

Figure 3:
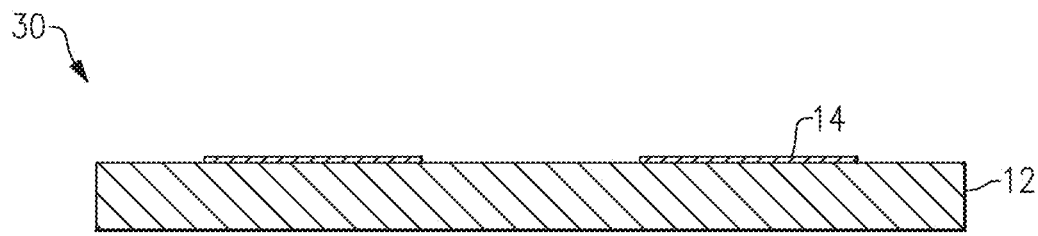
FIG. 3 is a cross sectional diagram of a baseline laterally excited bulk acoustic wave device.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Laterally excited bulk acoustic wave resonators can be include in acoustic wave filters for high frequency bands, such as frequency bands above 3 gigahertz (GHz) and/or frequency bands above 5 GHz. Such frequency bands can include a fifth generation (5G) New Radio (NR) operating band. Certain laterally excited bulk acoustic wave resonators can include an interdigital transducer (IDT) electrode on a relatively thin piezoelectric layer. A bulk acoustic wave (BAW) mode excited by the IDT electrode is not strongly affected by the pitch of IDT electrode in certain applications. Accordingly, such a resonator to have a higher operating frequency than certain conventional surface acoustic wave (SAW) resonators. Certain laterally excited bulk acoustic wave resonators can be free standing. However, heat dissipation can be undesirable for such free standing laterally excited bulk acoustic wave resonators. Power durability and/or mechanical ruggedness of such laterally excited bulk acoustic wave resonators can be a technical concern. Free standing laterally excited bulk acoustic wave resonators with lithium niobate or lithium tantalate piezoelectric layers can encounter problems related to power durability in transmit filter applications.

Heat dissipation and mechanical ruggedness can be improved by bonding a piezoelectric layer to a support substrate with a relatively high thermal conductivity. By bonding the piezoelectric layer directly to the support substrate, resonant characteristics can be degraded by leakage into support substrate.

Aspects of this disclosure relate to a laterally excited bulk acoustic wave resonator with a solid acoustic mirror positioned between a piezoelectric layer and a support substrate. An IDT electrode can be positioned on the piezoelectric layer. The support substrate can have a relatively high thermal conductivity. For example, the support substrate can be a silicon support substrate. The solid acoustic mirror, which can be an acoustic Bragg reflector, can reduce and/or eliminate leakage into the support substrate. With such a structure, acoustic energy can be confined over the solid acoustic mirror effectively and heat can flow though the support substrate with the relatively high thermal conductivity. Mechanical ruggedness of such a laterally exited bulk acoustic wave resonator can be improved by avoiding an air cavity. At the same time, a relatively high frequency resonance can be achieved with desirable power durability.

Aspects of this disclosure relate to a laterally excited bulk acoustic wave resonator with a piezoelectric layer positioned between a double solid acoustic mirror structure on a support substrate. A second substrate can be positioned on an opposite side of the double solid acoustic mirror structure than the support substrate. An IDT electrode can be positioned on the piezoelectric layer. Such a laterally excited bulk acoustic wave resonator can achieve desirable heat dissipation and mechanical ruggedness. At the same time, the laterally excited bulk acoustic wave resonator can achieve a relatively high frequency resonance and desirable power durability. The package structure can also be less complex relative to a laterally excited bulk acoustic wave resonator with an air cavity.

A laterally excited bulk acoustic wave device including any suitable combination of features disclosed herein be included in a filter arranged to filter a radio frequency signal in a fifth generation 5G NR operating band within Frequency Range 1 (FR1). A filter arranged to filter a radio frequency signal in a 5G NR operating band can include one or more laterally excited bulk acoustic wave device disclosed herein. FR1 can be from 410 MHz to 7.125 GHz, for example, as specified in a current 5G NR specification.

A laterally excited bulk acoustic wave device disclosed herein can be included in a filter arranged to filter a radio frequency signal having a frequency above FR1. For example, a laterally excited bulk acoustic wave device can be included in a filter arranged to filter radio frequency signals in a range from 10 GHz to 25 GHz. In applications where such high frequency signals are being transmitted, higher transmit powers can be used to account for higher loss in communication channels at higher frequencies. Accordingly, thermal dissipation at high frequencies of laterally excited bulk acoustic wave devices disclosed herein can be desirable.

In certain 5G applications, the thermal dissipation of the acoustic wave disclosed herein can be advantageous. For example, such thermal dissipation can be desirable in 5G applications with a higher time-division duplexing (TDD) duty cycle compared to fourth generation (4G) Long Term Evolution (LTE) applications. As another example, there can be more ganging of filters and carrier aggregation in 5G applications than 4G LTE applications. Accordingly, signals can have higher power to account for losses associated with such ganging of filters and/or carrier aggregation. Thermal dissipation of laterally excited bulk acoustic wave devices disclosed can be implemented in these example applications to improve performance of filters.

One or more laterally excited bulk acoustic wave devices in accordance with any suitable principles and advantages disclosed herein can be included in a filter arranged to filter a radio frequency signal in a 4G LTE operating band and/or in a filter having a passband that includes a 4G LTE operating band and a 5G NR operating band.

FIG. 1A is cross sectional diagram of a laterally excited bulk acoustic wave device 10 according to an embodiment. The laterally excited bulk acoustic wave device 10 can be a laterally excited bulk acoustic wave resonator included in a filter. The laterally excited bulk acoustic wave device 10 can be any other suitable laterally excited bulk acoustic wave device, such as a device in a delay line. The laterally excited bulk acoustic wave device 10 can be implemented in relatively high frequency acoustic wave filters. Such acoustic wave filters can filter radio frequency signals having a frequencies above 3 GHz and/over above 5 GHz. As illustrated, the laterally excited bulk acoustic wave device 10 includes a piezoelectric layer 12, an IDT electrode 14, a first solid acoustic mirror 15, a second solid acoustic mirror 16, a first substrate 17, and a second substrate 18. The solid acoustic mirrors 15 and 16 can confine acoustic energy in the piezoelectric layer 12. The substrates 17 and 18 can function like heat sinks. The substrates 17 and 18 can provide thermal dissipation and improve power durability of the laterally excited bulk acoustic wave device 10.

The piezoelectric layer 12 can be a lithium based piezoelectric layer. For example, the piezoelectric layer 12 can be a lithium niobate layer. As another example, the piezoelectric layer 12 can be a lithium tantalate layer. In certain applications, the piezoelectric layer 12 can be an aluminum nitride layer. The piezoelectric layer 12 can be any other suitable piezoelectric layer.

In certain surface acoustic wave resonators, there can be horizontal acoustic wave propagation. In such surface acoustic wave resonators, IDT electrode pitch can set the resonant frequency. Limitations of photolithography can set a lower bound on IDT electrode pitch and, consequently, resonant frequency of certain surface acoustic wave resonators.

The laterally excited bulk acoustic wave device 10 can generate a Lamb wave that is laterally excited. A resonant frequency of the laterally excited bulk acoustic wave device 10 can depend on a thickness H1 of the piezoelectric layer 12. The thickness H1 of the piezoelectric layer 12 can be a dominant factor in determining the resonant frequency for the laterally excited bulk acoustic wave device 10. The pitch of the IDT electrode 14 can be a second order factor in determining resonant frequency of the laterally excited bulk acoustic wave device 10. A thickness of a low impedance layer, such as a silicon dioxide layer, directly over the piezoelectric layer 12 and the IDT electrode and/or directly under the piezoelectric layer 12 can have a secondary impact on the resonant frequency of the laterally excited bulk acoustic wave device 10. The thickness of such a low impedance layer can be sufficient to adjust resonant frequency for a shunt resonator and a series resonator of a filter.

The resonant frequency of the laterally excited bulk acoustic wave device 10 can be approximated based on Equations 1 and/or 2.

$$v = f * \lambda \qquad \text{(Equation 1)}$$

$$f = \frac{v}{2\lambda} \qquad \text{(Equation 2)}$$

In Equations 1 and 2, v can represent acoustic velocity in a piezoelectric material, f can represent resonant frequency, and $\lambda$ can represent 2 times the thickness H1 of the piezoelectric layer 12. Accordingly, a combination of the thickness H1 of the piezoelectric layer 12 and the acoustic velocity in the piezoelectric layer 12 can determine the approximate resonant frequency of the laterally excited bulk acoustic wave device 10. The resonant frequency can be increased by making the piezoelectric layer 12 thinner and/or by using a piezoelectric layer 12 with a higher acoustic velocity.

The piezoelectric layer 12 can be manufactured with a thickness H1 that is 0.2 micrometers or higher from the fabrication point of view. In certain applications, the piezoelectric layer can have a thickness H1>0.04 L from the electrical performance ($K^2$) point of view, in which L is IDT electrode pitch.

The laterally excited bulk acoustic wave device 10 with a 0.2 micrometer thick aluminum nitride piezoelectric layer 12 can have a resonant frequency of approximately 25 GHz based on Equations 1 and 2. Similarly, the laterally excited bulk acoustic wave device 10 with a 0.2 micrometer thick lithium niobate piezoelectric layer 12 can have a resonant frequency of approximately 10 GHz. The laterally excited bulk acoustic wave device 10 with a 0.4 micrometer thick lithium niobate piezoelectric layer 12 can have a resonant frequency of approximately 5 GHz. Based on the piezoelectric materials and thickness of the piezoelectric layer, the resonant frequency of the laterally excited bulk acoustic wave device 10 can be designed for filtering an RF signal having a particular frequency.

Odd harmonics for a laterally excited bulk acoustic wave resonator can have a $k^2$ that is sufficiently large for a ladder filter in certain applications. Such odd harmonics (e.g., a $3^{rd}$ harmonic) can have a $k^2$ that is proportional to fundamental mode $k^2$. A laterally excited bulk acoustic wave resonator using an odd harmonic can have a lithium niobate piezoelectric layer.

Filters that include one or more laterally excited bulk acoustic wave devices 10 can filter radio frequency signals up to about 10 GHz with a relatively wide bandwidth. Filters that include one or more laterally excited bulk acoustic wave devices 10 can filter radio frequency signals having a frequency in a range from 10 GHz to 25 GHz. In some instances, a filter that include one or more laterally excited bulk acoustic wave devices 10 can filter an RF signal having a frequency in a range from 3 GHz to 5 GHz, a range from 4.5 GHz to 10 GHz, a range from 5 GHz to 10 GHz, or a range from 10 GHz to 25 GHz.

In the laterally excited bulk acoustic wave device 10, the IDT electrode 14 is over the piezoelectric layer 12. As illustrated, the IDT electrode 14 has a first side in physical contact with the piezoelectric layer 12 and a second side in physical contact with a layer of the solid acoustic mirror 16. The IDT electrode 14 can include aluminum (Al), molybdenum (Mo), tungsten (W), gold (Au), silver (Ag), copper (Cu), platinum (Pt), ruthenium (Ru), titanium (Ti), the like, or any suitable combination or alloy thereof. The IDT electrode 14 can be a multi-layer IDT electrode in some applications.

The first solid acoustic mirror 15 includes alternating low impedance layers 20A and high impedance layers 22A. Accordingly, the first solid acoustic mirror 15 is an acoustic Bragg reflector. The second solid acoustic mirror 16 includes alternating low impedance layers 20B and high impedance layers 22B. Accordingly, the second solid acoustic mirror 16 is an acoustic Bragg reflector. The low impedance layers 20A and/or 20B can be any suitable low impedance material such as silicon dioxide ($SiO_2$) or the like. The low impedance layers 20A and 20B can be the same material as each other in certain applications. The high impedance layers 22A and/or 22B can be any suitable high impedance material such as platinum (Pt), tungsten (W), iridium (Ir), aluminum nitride (AlN), molybdenum (Mo), or the like. The high impedance layers 22A and 22B can be the same material as each other in certain applications.

As illustrated, the layer of the first solid acoustic mirror 15 closest to the piezoelectric layer 12 is a low impedance layer 20A. Having a low impedance layer 20A closest to the piezoelectric layer 12 can increase an electromechanical coupling coefficient ($k^2$) of the laterally excited bulk acoustic wave device 10 and/or bring a temperature coefficient of frequency (TCF) of the laterally excited bulk acoustic wave device 10 closer to 0 in certain instances.

As illustrated, the layer of the first solid acoustic mirror 15 closest to the first substrate 17 is a high impedance layer 22A. Having a high impedance layer 22A closest to the first substrate 17 can increase reflection of the layer of the first solid acoustic mirror 15 closest to the first substrate 17. Alternatively, a solid acoustic mirror (not illustrated) with a low impedance layer 20A closest to the first substrate 17 can have a higher adhesion with the first substrate 17. For example, when the first substrate 17 is a silicon substrate, the first substrate should have a higher adhesion with a solid acoustic mirror with a silicon dioxide low impedance layer 20A that is closest to the support substrate (not illustrated) relative to the having a platinum high impedance layer 22A closest to the first substrate 17. A low impedance layer of an acoustic mirror in contact with the first substrate 17 can have a reduced thickness compared to other low impedance layers of the acoustic mirror in certain applications.

As illustrated, the layer of the second solid acoustic mirror 16 closest to the piezoelectric layer 12 is a low impedance layer 20B. Having a low impedance layer 20B closest to the piezoelectric layer 12 can increase an electromechanical coupling coefficient of the laterally excited bulk acoustic wave device 10 and/or bring a TCF of the laterally excited bulk acoustic wave device 10 closer to 0 in certain instances.

As illustrated, the layer of the second solid acoustic mirror 16 closest to the second substrate 18 is a high impedance layer 22B. Having a high impedance layer 22B closest to the second substrate 18 can increase reflection of the layer of the second solid acoustic mirror 16 closest to the second substrate 18. Alternatively, a solid acoustic mirror (not illustrated) with a low impedance layer 20B closest to the second substrate 18 can have a higher adhesion with the first substrate 18. A low impedance layer of an acoustic mirror in contact with the second substrate 18 can have a reduced thickness compared to other low impedance layers of the acoustic mirror in certain applications.

The first substrate 17 can be any suitable support substrate. The first substrate 17 can have a relatively high thermal conductivity to dissipate heat associated with operation of the laterally excited bulk acoustic wave device 10. The first substrate 17 can be a silicon substrate. The first substrate 17 being a silicon substrate can be advantageous for processing during manufacture of the laterally excited bulk acoustic wave device 10 and provide desirable thermal conductivity. Silicon is also a relatively inexpensive material. The first substrate 17 can be an aluminum nitride substrate. In some other applications, the first substrate 17 can be a quartz substrate, a ceramic substrate, a glass substrate, a spinel substrate, a magnesium oxide spinel substrate, a sapphire substrate, a diamond substrate, a diamond like carbon substrate, a silicon carbide substrate, a silicon nitride substrate, or the like.

The second substrate 18 can be any suitable substrate. The second substrate 18 can have a relatively high thermal conductivity to dissipate heat associated with operation of the laterally excited bulk acoustic wave device 10. The second substrate 18 can be a silicon substrate. The second substrate 18 can be an aluminum nitride substrate. In some other applications, the second substrate 18 can be a quartz substrate, a ceramic substrate, a glass substrate, a spinel substrate, a magnesium oxide spinel substrate, a sapphire substrate, a diamond substrate, a diamond like carbon substrate, a silicon carbide substrate, a silicon nitride substrate, or the like.

In certain instances, the first substrate 17 and the second substrate 18 can have similar thicknesses to account for thermal expansion. The first substrate 17 and the second substrate 18 can be of the same material in certain applications.

FIG. 1B illustrates the IDT electrode 14 of the laterally excited bulk acoustic wave device 10 of FIG. 1A in plan view. Only the IDT electrode 14 of the laterally excited bulk acoustic wave device 10 is shown in FIG. 1B. The IDT electrode 14 includes a bus bar 24 and IDT fingers 26 extending from the bus bar 24. The IDT fingers 26 have a pitch of λ. As discussed above, the pitch λ can have less impact than the thickness of the piezoelectric layer 12 in the laterally excited bulk acoustic wave device 10. The laterally excited bulk acoustic wave device 10 can include any suitable number of IDT fingers 26.

FIG. 2A is a cross sectional diagram of a laterally excited bulk acoustic wave device 28 with a solid acoustic mirror 15 according to an embodiment. The laterally excited bulk acoustic wave device 28 can be a laterally excited bulk acoustic wave resonator included in a filter. The laterally excited bulk acoustic wave device 28 can be any other suitable laterally excited bulk acoustic wave device, such as a device in a delay line. FIG. 2A illustrates that a single solid acoustic mirror 15 can be implemented in certain applications. As illustrated, the laterally excited bulk acoustic wave device 28 includes a support substrate 17, a solid acoustic mirror 15 on the support substrate 17, a piezoelectric layer 12 on the solid acoustic mirror 15, and an IDT electrode 14 on the piezoelectric layer 12. The IDT electrode 14 is arranged to laterally excite a bulk acoustic wave.

The piezoelectric layer 12 can have a thickness in a range from 0.2 micrometers to 0.4 micrometers in certain applications. The piezoelectric layer can have a thickness in a range from 0.2 micrometers to 0.3 micrometers.

The solid acoustic mirror 15 can confine acoustic energy. The solid acoustic mirror 15 can confine acoustic energy such that the support substrate 17 is free from acoustic energy during operation of the laterally excited bulk acoustic wave device 28. At least one of the low impedance layers 20 and/or at least one of the high impedance layers 22 can be free from acoustic energy during operation of the laterally excited bulk acoustic wave device 28.

The support substrate 17 can dissipate heat associated with generating a laterally excited bulk acoustic wave. The support substrate 17 has a thermal conductivity that is higher than a thermal conductivity of the piezoelectric layer 12. The support substrate 17 can be a silicon substrate.

Filters that include one or more laterally excited bulk acoustic wave devices 28 can filter an RF signal having a frequency in a range from 3 GHz to 5 GHz, a range from 4.5 GHz to 10 GHz, a range from 5 GHz to 10 GHz, or a range from 10 GHz to 25 GHz.

FIG. 2B is a cross sectional view showing heat flow in the laterally excited bulk acoustic wave device 28 of FIG. 2A. During operation, heat can be generated by the IDT electrode 14. This heat can flow through the piezoelectric layer 12 and the solid acoustic mirror 15 to the substrate 17. Accordingly, the solid acoustic mirror 15 can provide a heat flow path from the piezoelectric layer 12 to the substrate 17. The substrate 17 can have a relatively high thermal conductivity and provide heat dissipation. The substrate 17 can increase mechanical durability.

FIG. 3 is a cross sectional diagram of a baseline laterally excited bulk acoustic wave device 30. As illustrated, the baseline laterally excited bulk acoustic wave device 30 includes a piezoelectric layer 12 and an IDT electrode 14 on the piezoelectric layer 12. The laterally excited bulk acoustic wave device 30 can be a free standing device supported over a support substrate. There can be an air cavity positioned between the piezoelectric layer 12 and the support substrate.

Figure 4A:
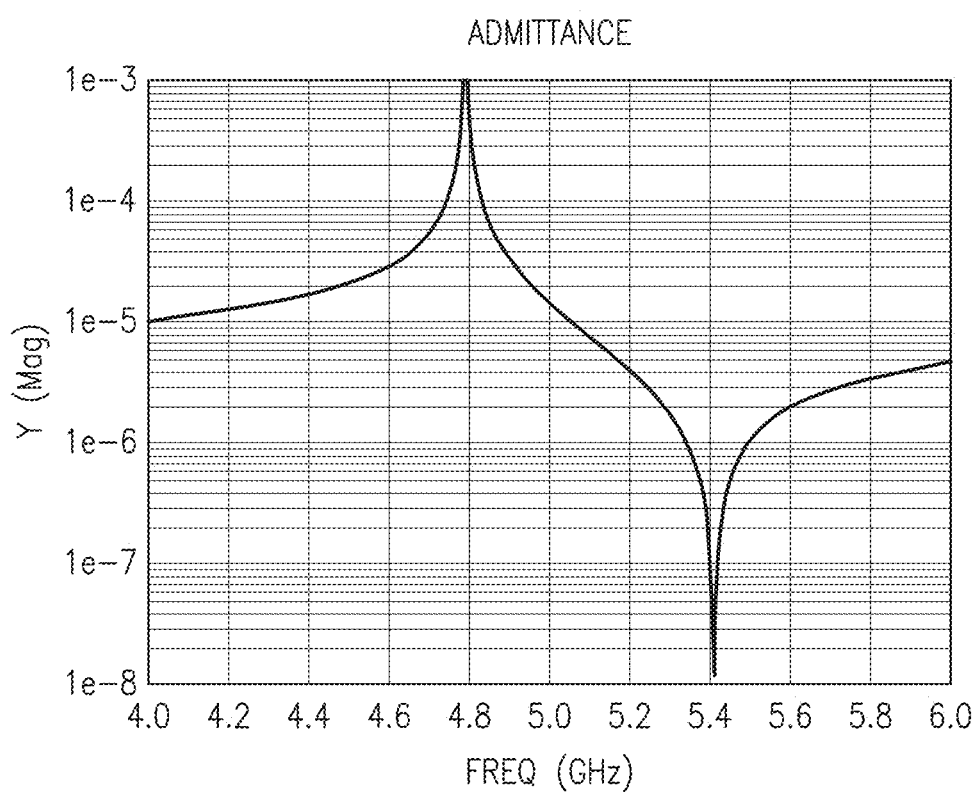
FIG. 4A is graph of admittance of the baseline laterally excited bulk acoustic wave device of FIG. 3.

FIG. 4A is graph of admittance of the baseline laterally excited bulk acoustic wave device 30 of FIG. 3. This graph shows a relatively clean frequency response with a resonant frequency at around 4.8 GHz and an anti-resonant frequency around 5.4 GHz.

Figure 4B:
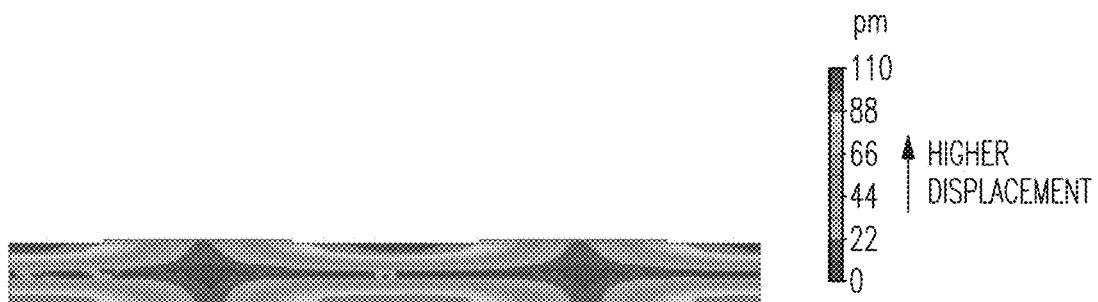
FIG. 4B illustrates displacement at a resonant frequency for the baseline laterally excited bulk acoustic wave device of FIG. 3.

FIG. 4B illustrates displacement at a resonant frequency for the baseline laterally excited bulk acoustic wave device 30 of FIG. 3. FIG. 4B indicates displacement in the piezoelectric layer 12 at the resonant frequency.

Figure 4C:
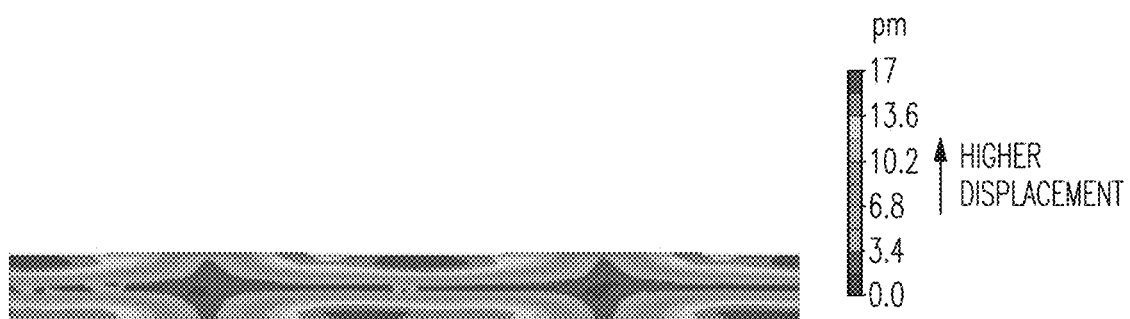
FIG. 4C illustrates displacement at an anti-resonant frequency for the baseline laterally excited bulk acoustic wave device of FIG. 3.

FIG. 4C illustrates displacement at an anti-resonant frequency for the baseline laterally excited bulk acoustic wave device 30 of FIG. 3. FIG. 4C indicates displacement in the piezoelectric layer 12 at the anti-resonant frequency.

Figure 5:
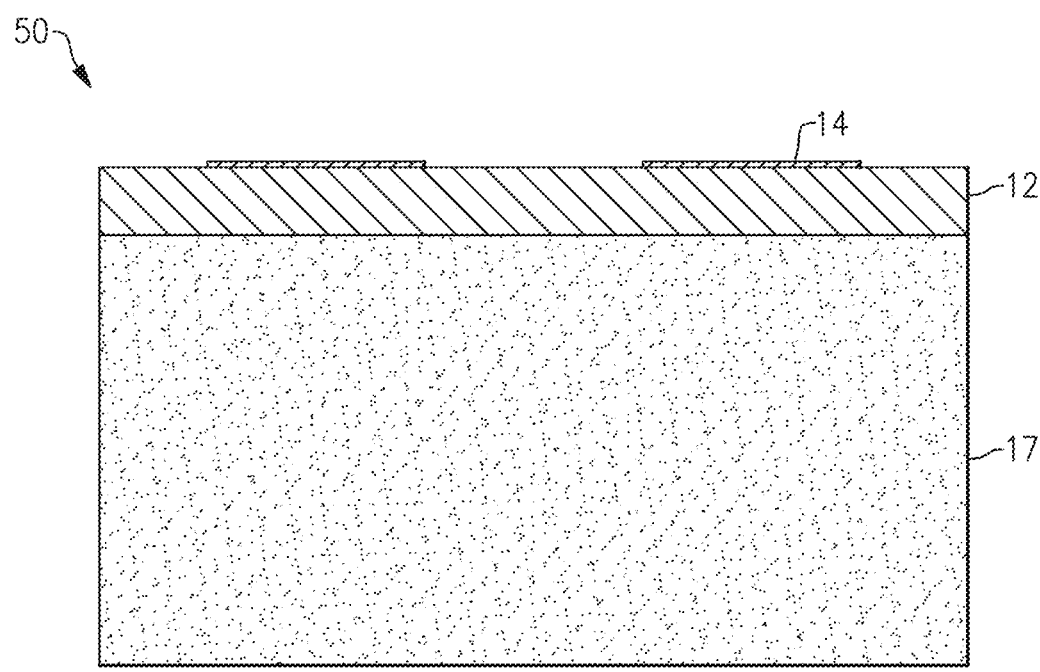
FIG. 5 is a cross sectional diagram of a laterally excited bulk acoustic wave device with a support substrate in contact with a piezoelectric layer.

FIG. 5 is a cross sectional diagram of a laterally excited bulk acoustic wave device 50 with a support substrate in contact with a piezoelectric layer. As illustrated, the laterally excited bulk acoustic wave device 50 includes a piezoelectric layer 12, an IDT electrode 14 on a first side of the piezoelectric layer 12, and a support substrate 17 in contact with a second side of the piezoelectric layer 12 that is opposite to the first side. The support substrate 17 can be a silicon substrate. The support substrate 17 can dissipate heat associated with operation of the laterally excited bulk acoustic wave device 50.

Figure 6A:
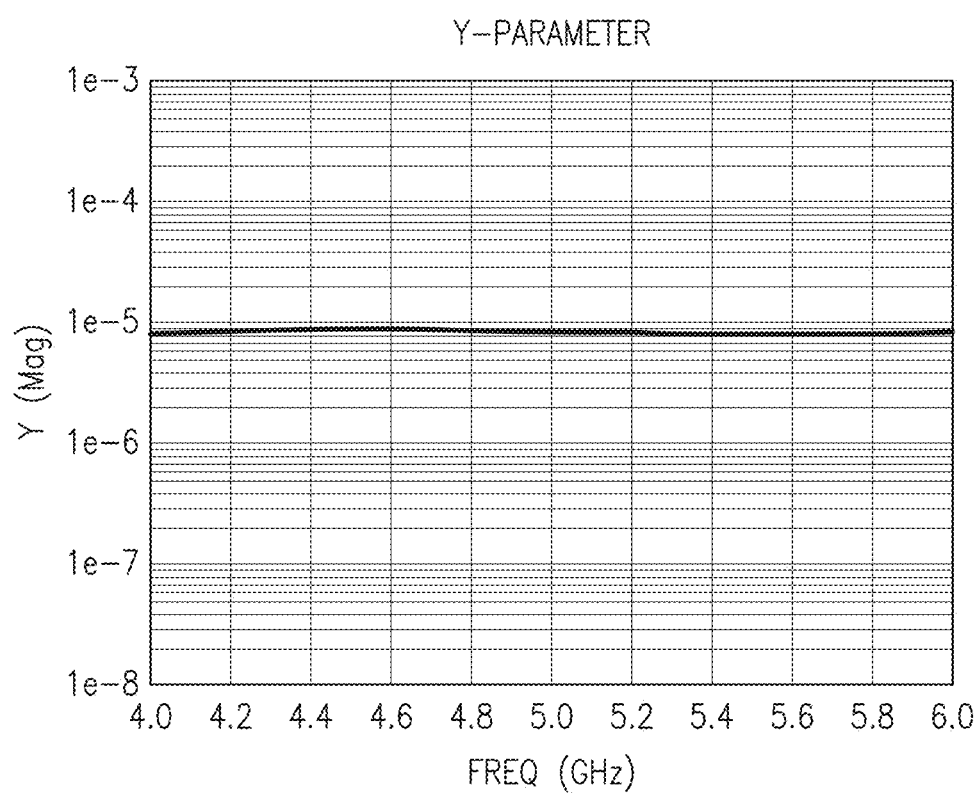
FIG. 6A is graph of admittance of the laterally excited bulk acoustic wave device of FIG. 5.

FIG. 6A is graph of admittance of the laterally excited bulk acoustic wave device 50 of FIG. 5, in which the support substrate 17 is a silicon substrate. This graph indicates that the laterally excited bulk acoustic wave device 50 produces a low quality factor (Q) that is generally undesirable for an acoustic wave filter.

Figure 6B:
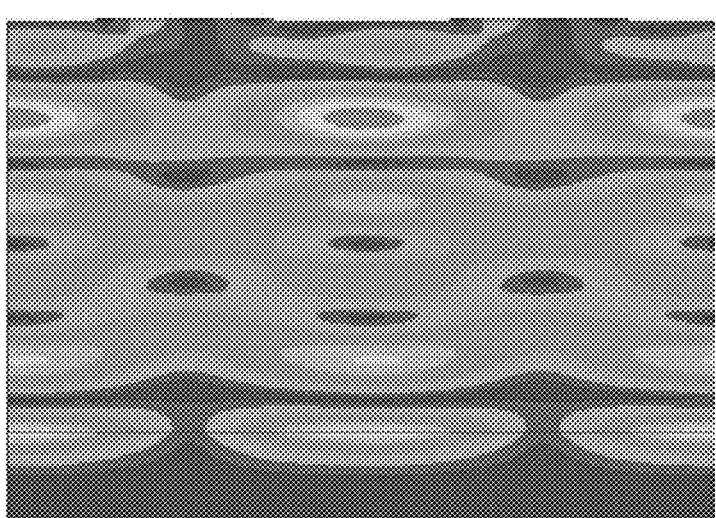
FIG. 6B illustrates displacement at a resonant frequency for the laterally excited bulk acoustic wave device of FIG. 5.

FIG. 6B illustrates displacement at a resonant frequency for the laterally excited bulk acoustic wave device 50 of FIG. 5, in which the support substrate 17 is a silicon substrate. FIG. 6B indicates acoustic energy leakage into the silicon substrate at the resonant frequency.

Figure 6C:
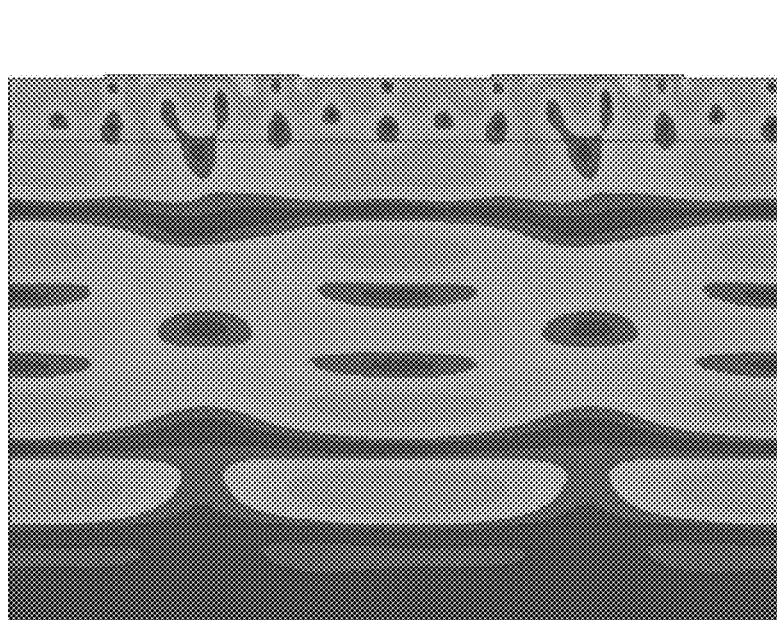
FIG. 6C illustrates displacement at an anti-resonant frequency for the laterally excited bulk acoustic wave device of FIG. 5.

FIG. 6C illustrates displacement at an anti-resonant frequency for the laterally excited bulk acoustic wave device 50 of FIG. 5, in which the support substrate 17 is a silicon substrate. FIG. 6B indicates acoustic energy leakage into the silicon substrate at the anti-resonant frequency.

Figure 7:
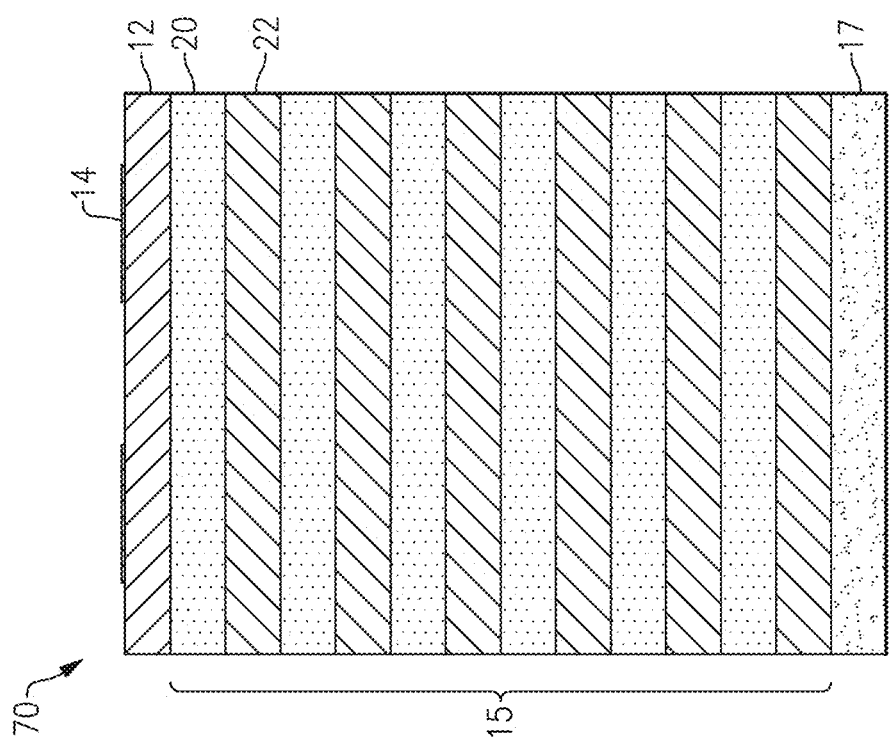
FIG. 7 is a cross sectional diagram of a laterally excited bulk acoustic wave device with a solid acoustic mirror according to an embodiment before design refinement.

FIG. 7 is a cross sectional diagram of a laterally excited bulk acoustic wave device 70 with a solid acoustic mirror according to an embodiment before design refinement and/or optimization. The laterally excited bulk acoustic wave device 70 includes a piezoelectric layer 12, an interdigital transducer electrode 14 on the piezoelectric layer 12, a solid acoustic mirror 15 including alternating low impedance layers 20 and high impedance layers 22, and a support substrate 17. The solid acoustic mirror 15 is positioned between the support substrate 17 and the piezoelectric layer 12. The solid acoustic mirror 15 is not optimized in the laterally excited bulk acoustic wave device 70. In FIG. 7, the support substrate 17 is not necessarily shown to scale. The support substrate 17 can be the thickest element illustrated in the laterally excited bulk acoustic wave device 70.

Figure 8A:
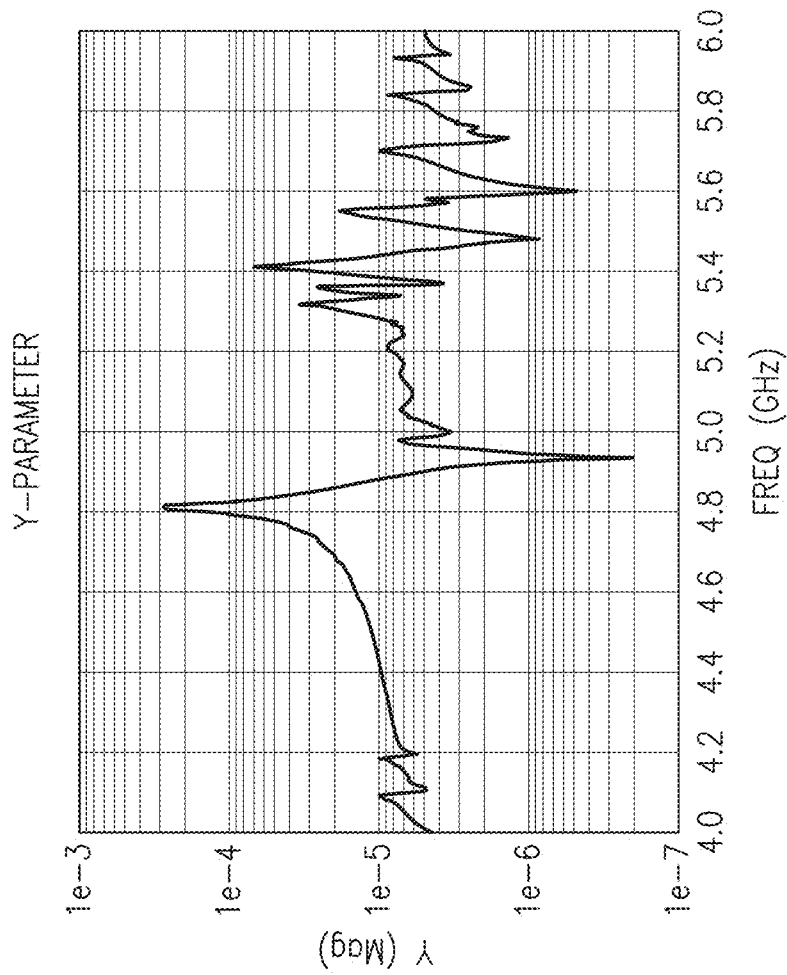
FIG. 8A is graph of admittance of the laterally excited bulk acoustic wave device of FIG. 7.
Figure 8B:
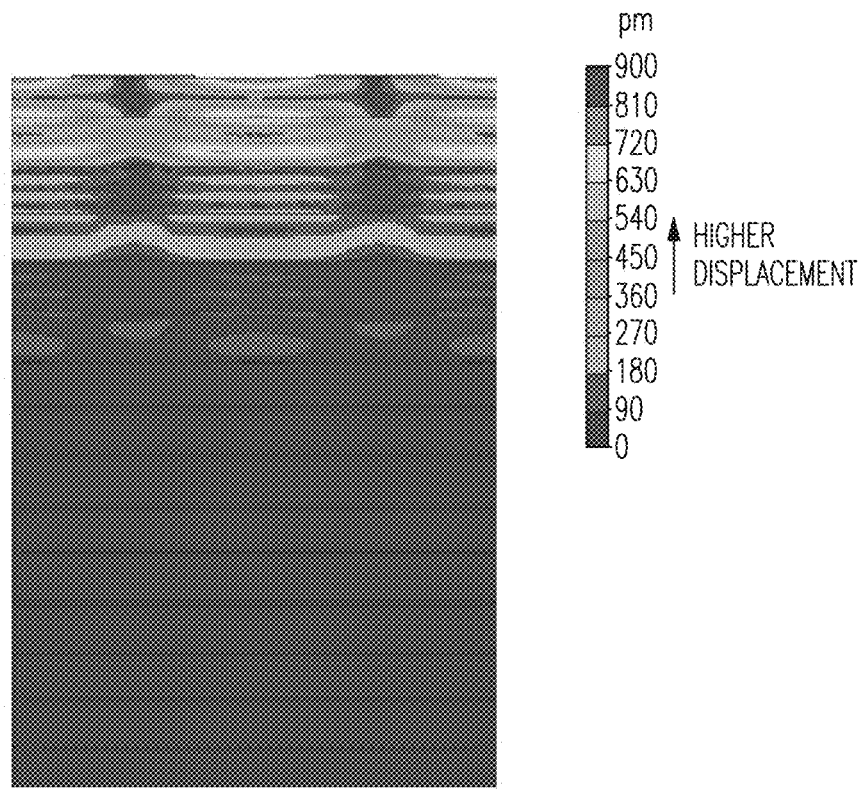
FIG. 8B illustrates displacement at a resonant frequency for the laterally excited bulk acoustic wave device of FIG. 7.
Figure 8C:
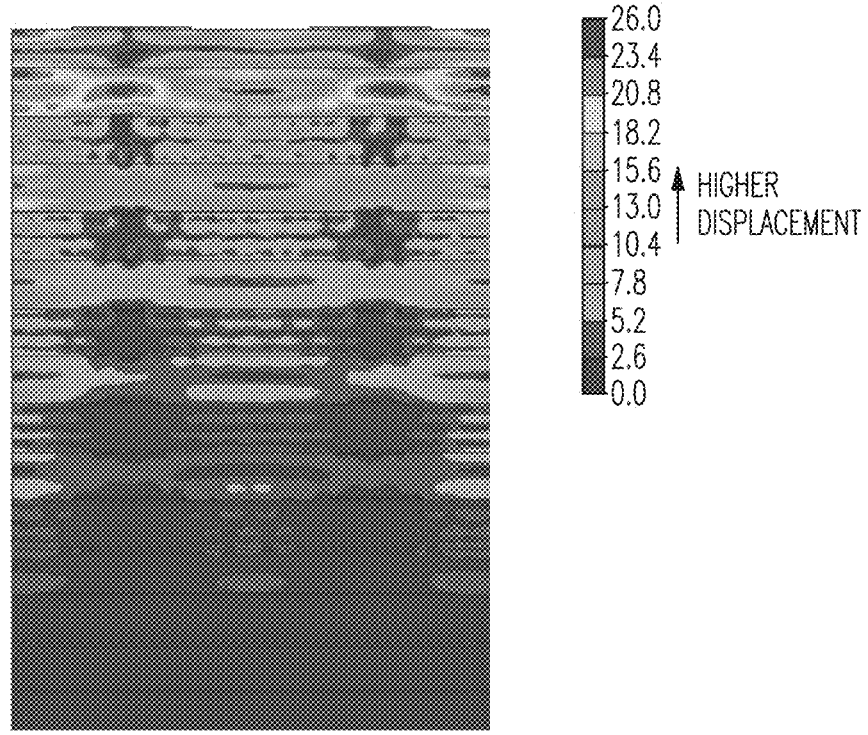
FIG. 8C illustrates displacement at an anti-resonant frequency for the laterally excited bulk acoustic wave device of FIG. 7.

In the simulations for FIGS. 8A to 8C, the acoustic mirror includes silicon dioxide low impedance layers having a thickness of 0.1λ and platinum (Pt) high impedance layers having a thickness of 0.1λ. The performance of the laterally excited bulk acoustic wave device 70 in these simulations is degraded. This can be due to the high impedance layers having a thickness that is away from range that leads to better performance.

FIG. 8A is graph of admittance of the laterally excited bulk acoustic wave device 70 of FIG. 7. This graph shows a generally undesirable frequency response.

FIG. 8B illustrates displacement at a resonant frequency for the laterally excited bulk acoustic wave device 70 of FIG. 7. FIG. 8B indicates some acoustic energy leakage into the middle layers of the solid acoustic mirror 15 at the resonant frequency.

FIG. 8C illustrates displacement at an anti-resonant frequency for the laterally excited bulk acoustic wave device 70 of FIG. 7. FIG. 8C indicates acoustic energy leakage into the middle and lower layers of the solid acoustic mirror 15 at the anti-resonant frequency.

Figure 9:
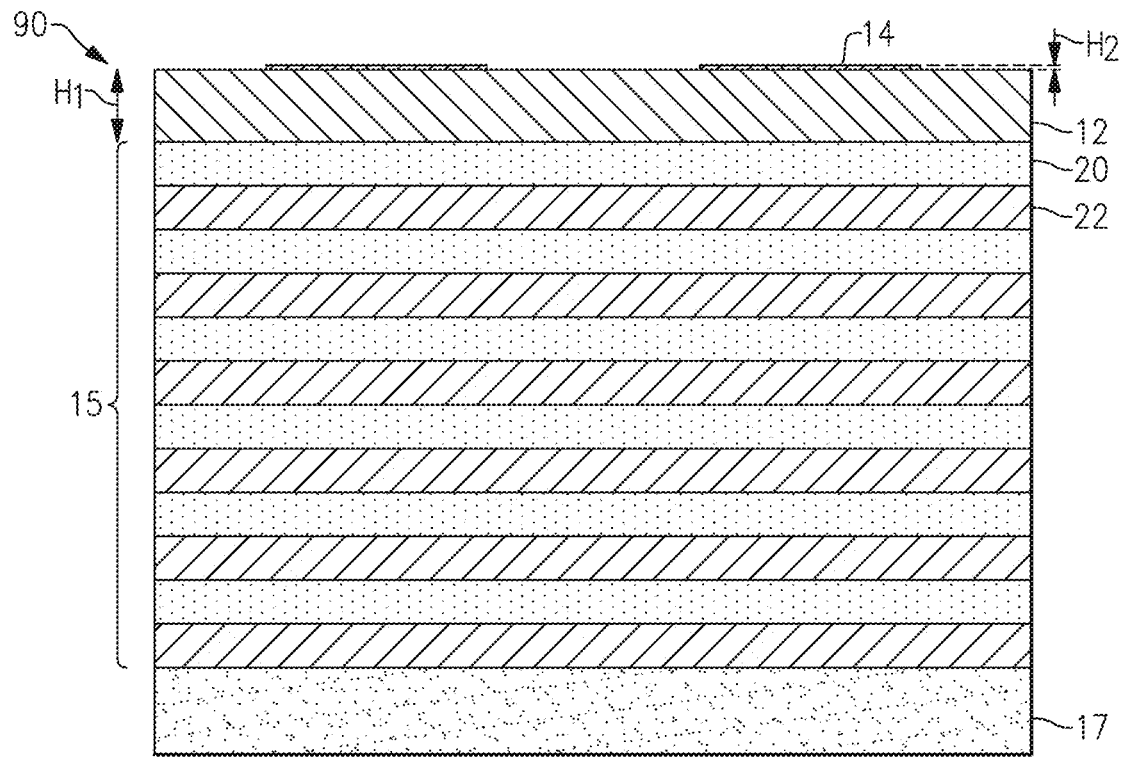
FIG. 9 is a cross sectional diagram of a laterally excited bulk acoustic wave device with a solid acoustic mirror according to an embodiment.

FIG. 9 is a cross sectional diagram of a laterally excited bulk acoustic wave device 90 with a solid acoustic mirror according to an embodiment. The laterally excited bulk acoustic wave device 90 is like the laterally excited bulk acoustic wave device 70 of FIG. 7, except that the laterally excited bulk acoustic wave device 90 is modified to increase confinement of acoustic energy and produce a cleaner frequency response. In FIG. 9, the support substrate 17 is not necessarily shown to scale. The support substrate 17 can be the thickest element illustrated in the laterally excited bulk acoustic wave device 90.

The piezoelectric layer 12 can have a thickness to increase performance of the laterally excited bulk acoustic wave device 90. For example, the piezoelectric layer 12 can have a thickness in a range from about 0.04λ to 0.5λ, in which λ is IDT electrode pitch. As one example, the piezoelectric layer 12 can have a thickness of about 0.08λ.

The layers of the solid acoustic mirror 15 can each have a thickness to increase performance of the laterally excited bulk acoustic wave device 90. For example, the low impedance layers 20 can be silicon dioxide layers having a thickness in a range from 0.02λ, to 0.10λ. The high impedance layers can be platinum layers having a thickness in a range from 0.01λ, to 0.03λ, or 0.04λ, to 0.06λ. As one example, the low impedance layers 20 and high impedance layers 22 can each have a thickness of about 0.05λ. Preferred mirror layer thickness can vary for material. For example, in the case with high impedance layers that are tungsten, preferred thickness of the high impedance layer can be in a range from 0.017λ to 0.027λ or from 0.049λ to 0.059λ. For molybdenum high impedance layers, preferred thickness of each high impedance layer can be in a range from 0.040λ to 0.050λ or 0.010λ to 0.011λ. Normalized by wave length of longitudinal wave velocity $\lambda_p$ in each material, preferred low impedance layer thickness for each silicon dioxide low impedance layer can be in a range from $0.1\lambda_p$ to $0.3\lambda_p$ and each high impedance layer thickness can be in a range from about $0.14\lambda_p$ to $0.30\lambda_p$ or from about $0.35\lambda_p$ to $0.45\lambda_p$. In certain applications, the low impedance layers 20 and the high impedance layers 22 can have similar and/or approximately the same thicknesses. In some other applications, the low impedance layers 20 can have different thickness than the high impedance layers 22.

Figure 10A:
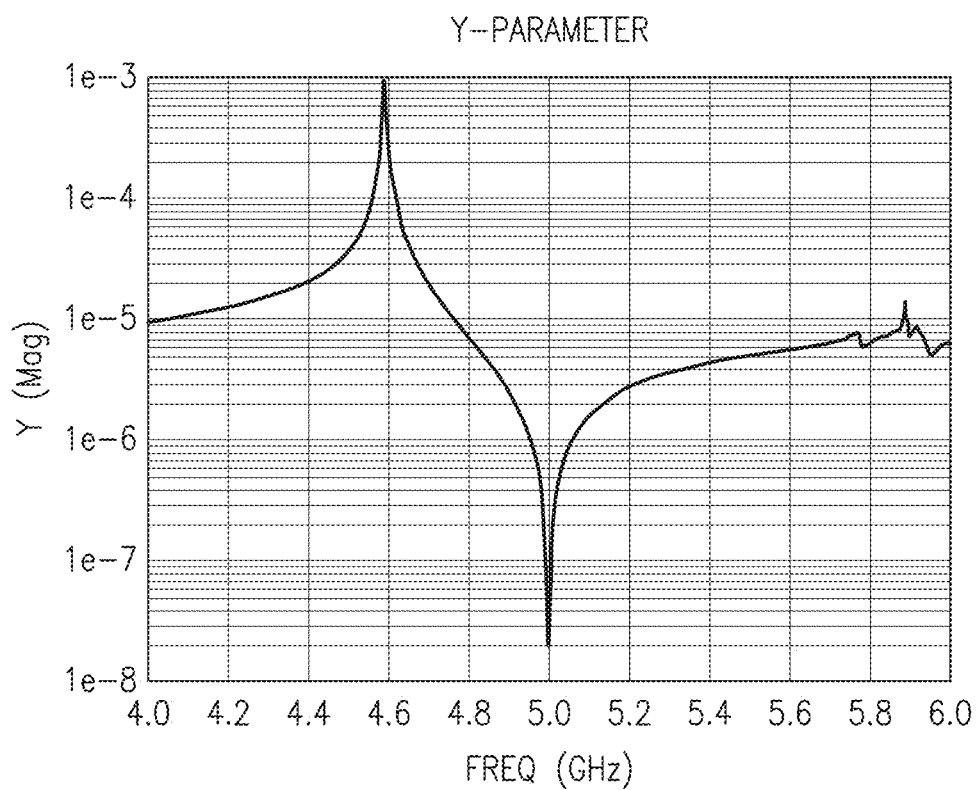
FIG. 10A is graph of admittance of the laterally excited bulk acoustic wave device of FIG. 9.
Figure 10B:
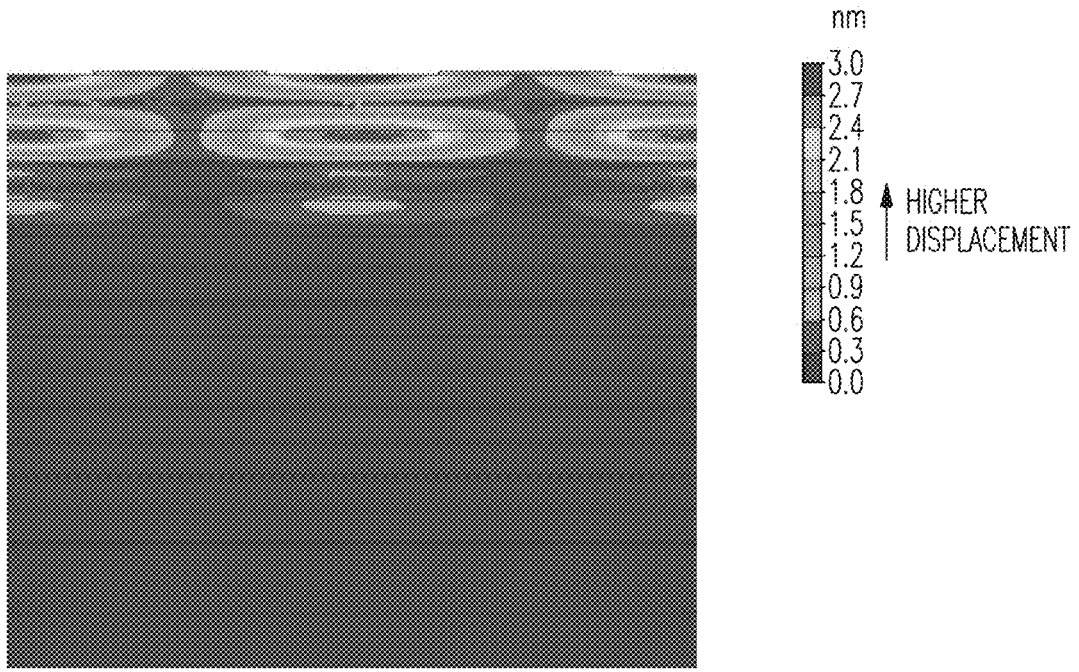
FIG. 10B illustrates displacement at a resonant frequency for the laterally excited bulk acoustic wave device of FIG. 9.
Figure 10C:
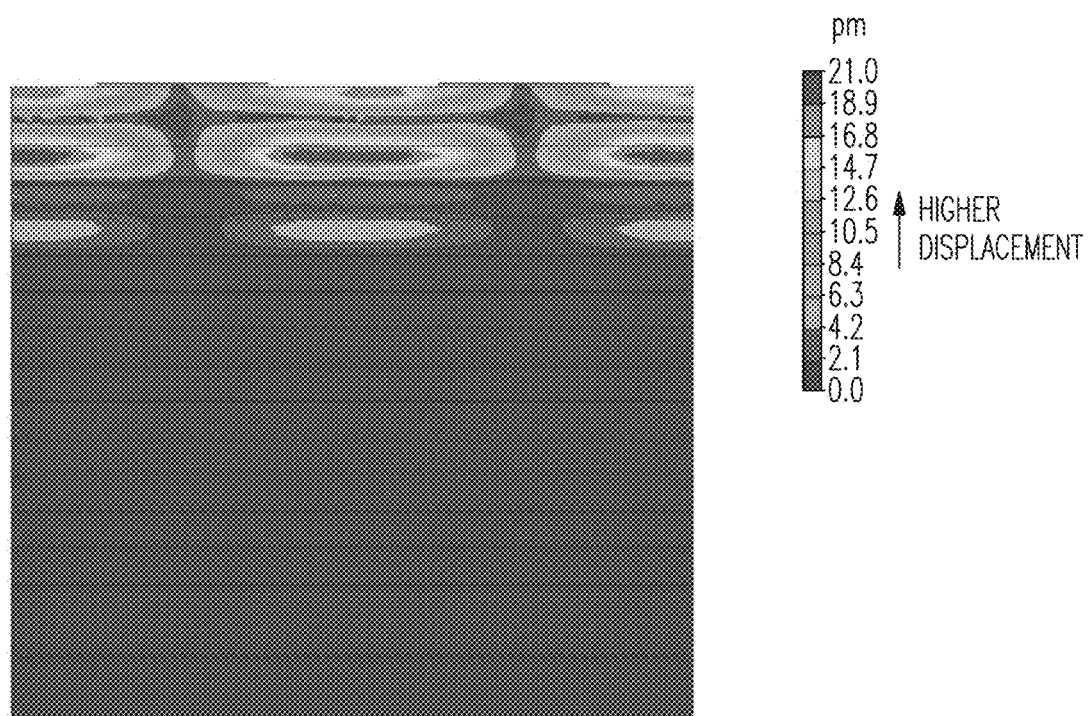
FIG. 10C illustrates displacement at an anti-resonant frequency for the laterally excited bulk acoustic wave device of FIG. 9.

The simulations in FIGS. 10A to 10C correspond to a piezoelectric layer thickness of 0.08λ and low impedance and high impedance layers 20 and 22, respectively, each having a thickness of 0.05λ.

FIG. 10A is graph of admittance of the laterally excited bulk acoustic wave device of FIG. 9. This graph shows a relatively clean frequency response with a resonant frequency at around 4.6 GHz and an anti-resonant frequency around 5.0 GHz.

FIG. 10B illustrates displacement at a resonant frequency for the laterally excited bulk acoustic wave device FIG. 9. FIG. 10B indicates that the acoustic energy in confined near the piezoelectric layer 12 at the resonant frequency in the laterally excited bulk acoustic wave device 90. FIG. 10B shows improve acoustic energy confinement relative to FIG. 8B.

FIG. 10C illustrates displacement at an anti-resonant frequency for the laterally excited bulk acoustic wave device of FIG. 9. FIG. 10C indicates that the acoustic energy in confined near the piezoelectric layer 12 at the anti-resonant frequency in the laterally excited bulk acoustic wave device 90. FIG. 10C shows improve acoustic energy confinement relative to FIG. 8C.

FIG. 10D is a graph corresponding to different thicknesses of the piezoelectric layer for the laterally excited bulk acoustic wave device 90 of FIG. 9. The different curves correspond to different thicknesses H1 for a lithium niobate piezoelectric layer 12. FIG. 10D indicates that the thickness H1 of the lithium niobate piezoelectric layer 12 can be at least 0.06 L to achieve a preferred electrical performance ($k^2$). The thickness H1 of lithium niobate piezoelectric layer 12 can be at least 200 nanometers from a fabrication point of view.

Figure 10E:
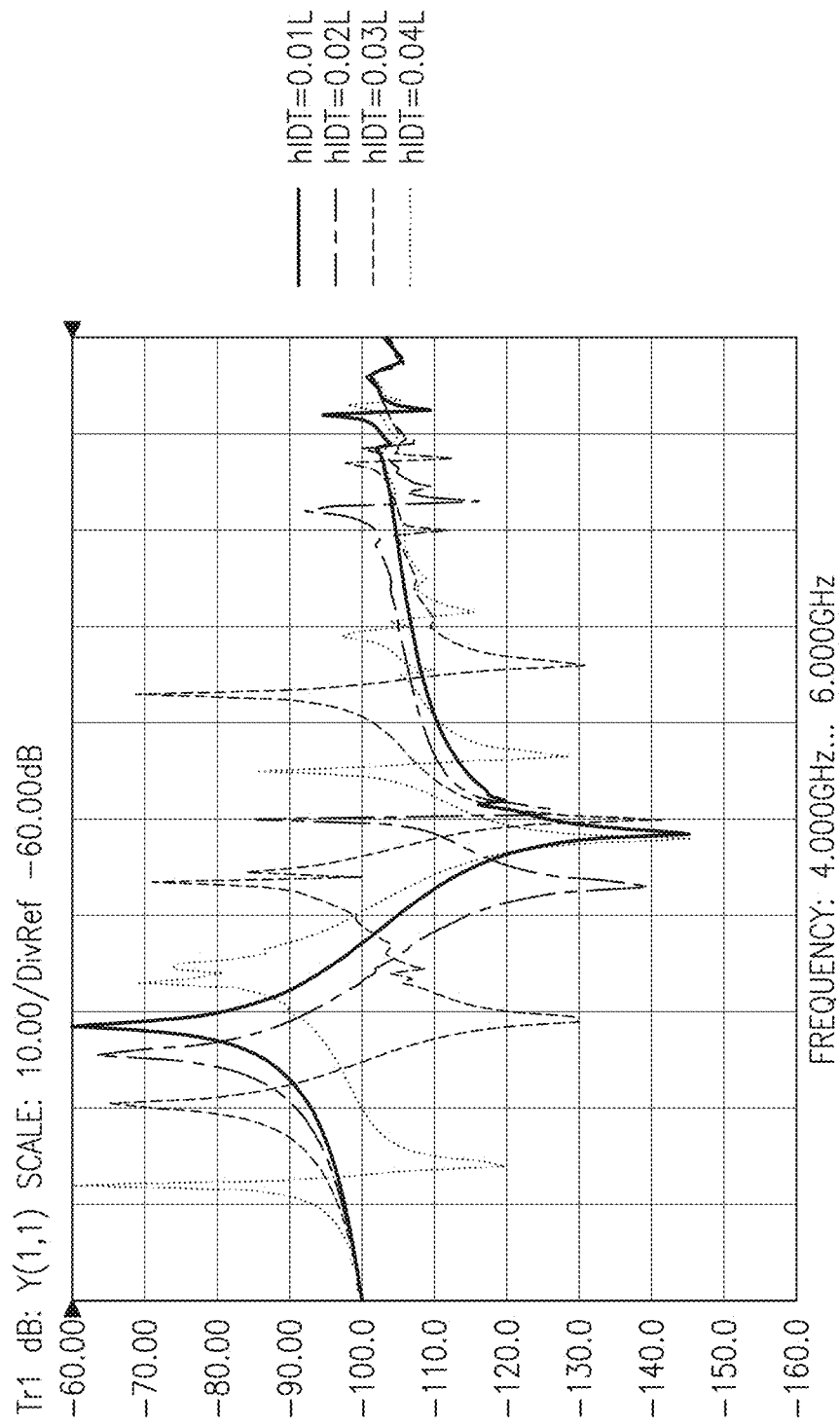
FIG. 10E is a graph corresponding to different thicknesses of the interdigital transducer electrode for the laterally excited bulk acoustic wave device of FIG. 9.

FIG. 10E is a graph corresponding to different thicknesses of the interdigital transducer electrode for the laterally excited bulk acoustic wave device 90 of FIG. 9. The different curves correspond to different thicknesses H2 for the IDT electrode 14. This graph indicates that an IDT electrode thickness H2 of greater than 0.02 L can excite a spurious mode. The simulations in FIG. 10E do not include the effect of IDT electrode resistivity.

Figure 10F:
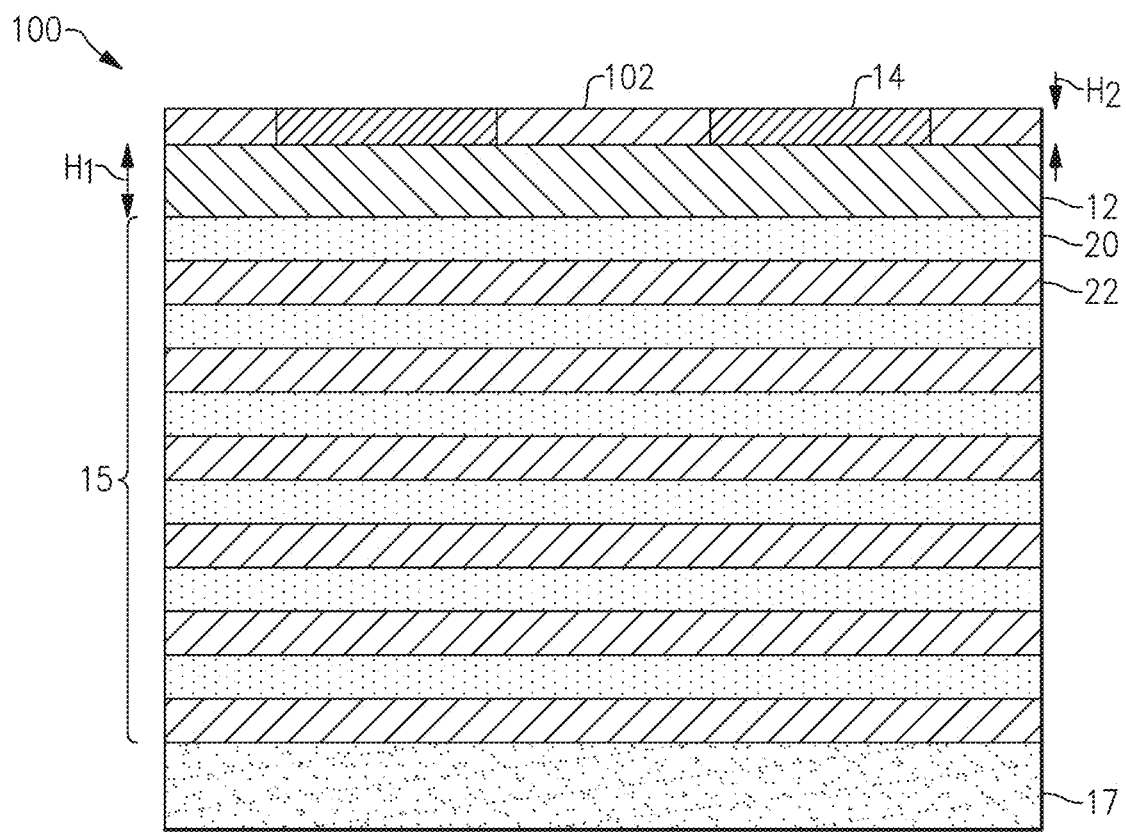
FIG. 10F is a cross sectional diagram of a laterally excited bulk acoustic wave device with a solid acoustic mirror and silicon dioxide between interdigital transducer electrode fingers according to an embodiment.

FIG. 10F is a cross sectional diagram of a laterally excited bulk acoustic wave device 100 with a solid acoustic mirror 15 and silicon dioxide 102 between fingers of the IDT electrode 14 according to an embodiment. The laterally excited bulk acoustic wave device 100 is like the laterally excited bulk acoustic wave device 90 of FIG. 9, except that silicon dioxide 102 is included between fingers of the IDT electrode 14. In some other instances (not illustrated), silicon dioxide and/or another temperature compensation layer can cover fingers of the IDT electrode 14.

Including silicon dioxide 102 between fingers of the IDT electrode 14 can suppress a spurious mode by thicker IDT electrodes. Resonant frequency can be dominated by total thickness of the piezoelectric layer 12 and silicon dioxide 102. An upper silicon dioxide layer (e.g., the silicon dioxide 102) can provide frequency tuning. A trimming range can be sufficient to cover series and parallel arms in a ladder type filter.

FIG. 10G is a graph corresponding to different thicknesses of the IDT electrode 14 for the laterally excited bulk acoustic wave device 100 of FIG. 10F. The simulations in FIG. 10G do not include the effect of IDT electrode resistivity.

Figure 11A:
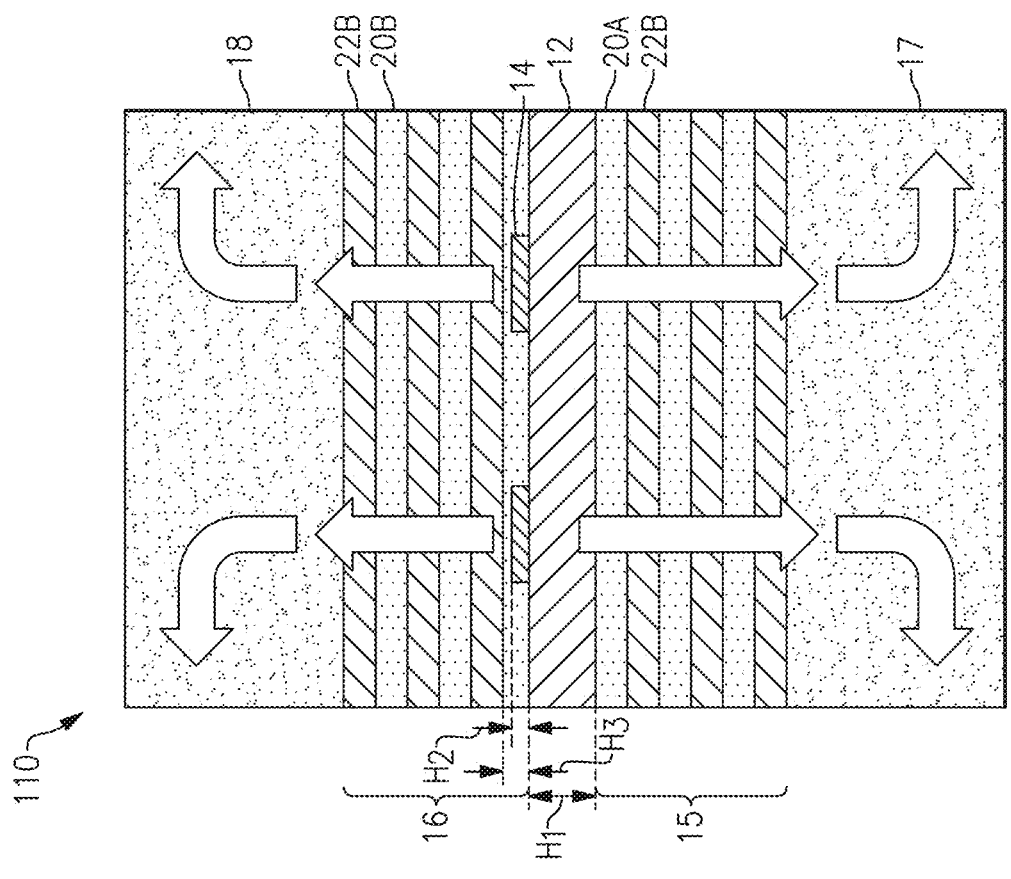
FIG. 11A is a cross sectional diagram of a laterally excited bulk acoustic wave device with a double solid acoustic mirror structure according to an embodiment.

FIG. 11A is a cross sectional diagram of a laterally excited bulk acoustic wave device 110 with a double solid acoustic mirror structure according to an embodiment. With the double solid acoustic mirror structure, a more complex package structure can be avoided. The laterally excited bulk acoustic wave device 110 can includes a pair of solid acoustic mirrors including a first solid acoustic mirror 15 and a second solid acoustic mirror 16, a piezoelectric layer 12 positioned between the first solid acoustic mirror 15 and the second solid acoustic mirror 16, an IDT electrode 14 on the piezoelectric layer 12, a first substrate 17 on which the first solid acoustic mirror 15 is positioned, and a second substrate 18 over the second solid acoustic mirror 16. The IDT electrode 14 is arranged to laterally excite a bulk acoustic wave. The first solid acoustic mirror 15 and the second solid acoustic mirror 16 are arranged to confine acoustic energy of the bulk acoustic wave. The first substrate 17 and the second substrate 18 are arranged to dissipate heat associated with the bulk acoustic wave. The laterally excited bulk acoustic wave device 110 can perform as described with reference to FIGS. 1A and/or 1B.

Figure 11B:
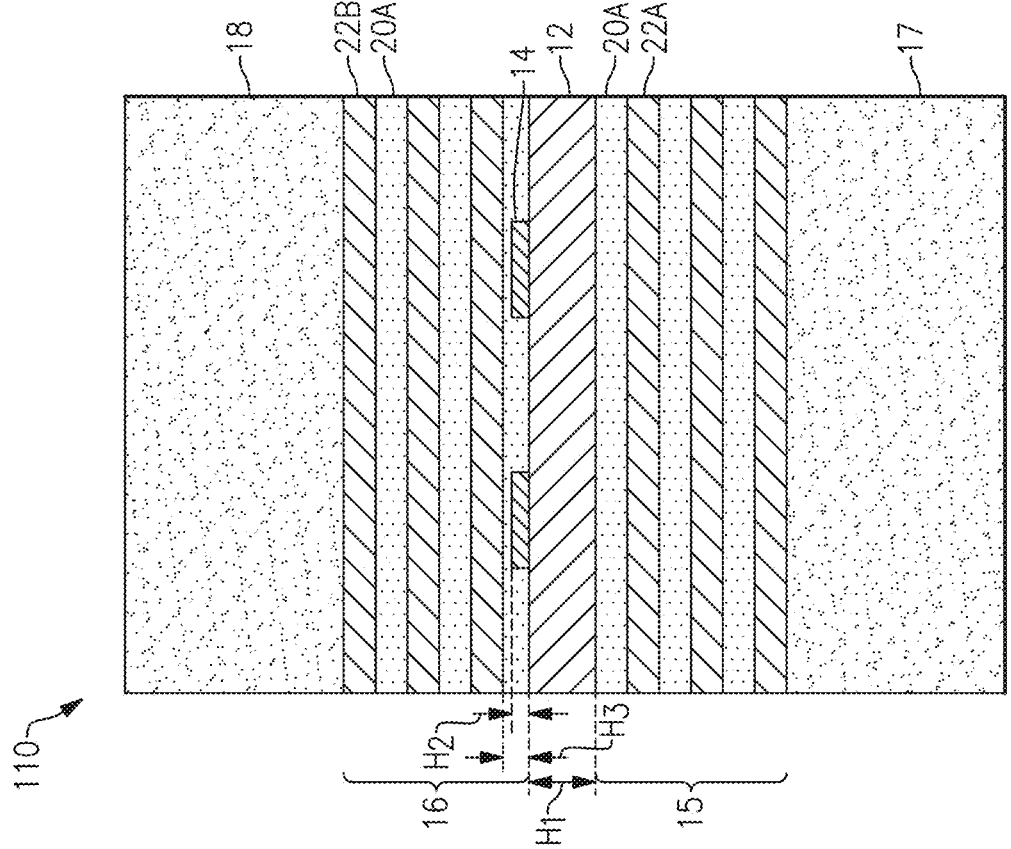
FIG. 11B is a cross sectional view showing heat flow in the laterally excited bulk acoustic wave device of FIG. 11A.

FIG. 11B is a cross sectional view showing heat flow in the laterally excited bulk acoustic wave device 110 of FIG. 11A. During operation, heat can be generated by the IDT electrode 14. This heat can flow through the piezoelectric layer 12 and the first solid acoustic mirror 15 to the first substrate 17. Accordingly, the first solid acoustic mirror 15 can provide a heat flow path from the piezoelectric layer 12 to the first substrate 17. The first substrate 17 can dissipate heat. Similarly, heat generated by the IDT electrode 14 can flow through the second solid acoustic mirror 16 to the second substrate 18. Accordingly, the second solid acoustic mirror 16 can provide a heat flow path from the IDT electrode 14 to the second substrate 18. The second substrate 18 can dissipate heat. The first solid acoustic mirror 15 and the second solid acoustic mirror 16 can confine acoustic energy during operation.

Figure 12A:
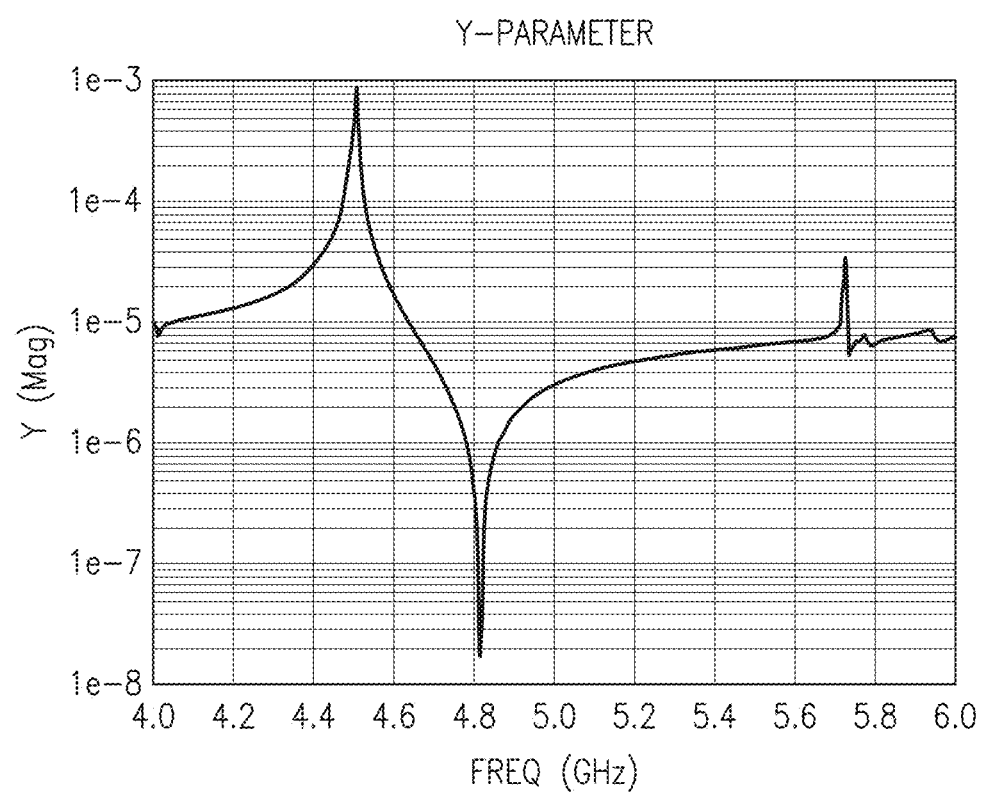
FIG. 12A is graph of admittance of the laterally excited bulk acoustic wave device with a double solid acoustic mirror structure of FIG. 11A.

FIG. 12A is graph of admittance of the laterally excited bulk acoustic wave device 110 of FIG. 11A. This graph shows a desirable frequency response. FIG. 12A indicates that the simulated laterally excited bulk acoustic wave device 110 has a resonant frequency at around 4.5 GHz and an anti-resonant frequency around 4.8 GHz.

Figure 12B:
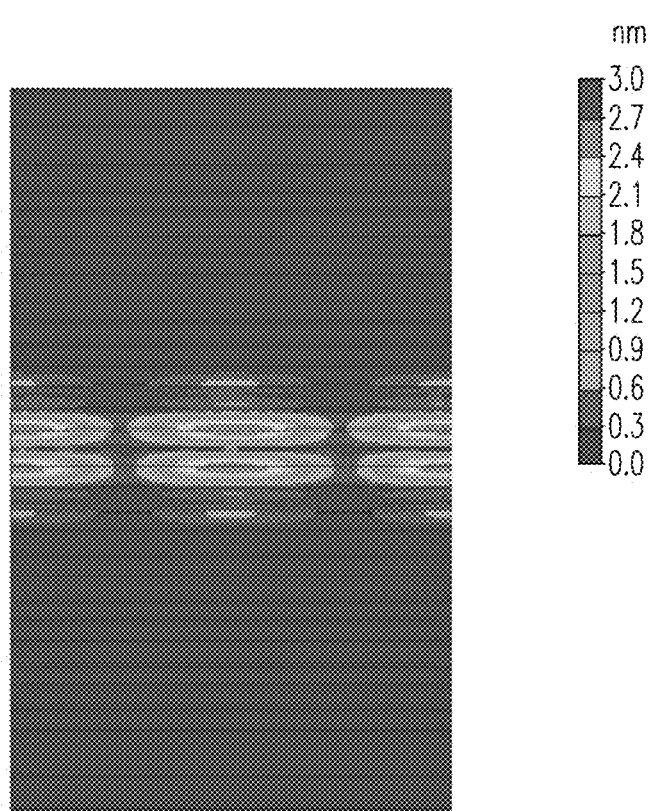
FIG. 12B illustrates displacement at a resonant frequency for the laterally excited bulk acoustic wave device with a double solid acoustic mirror structure of FIG. 11A.

FIG. 12B illustrates displacement at a resonant frequency for the laterally excited bulk acoustic wave device 110 of FIG. 11A. FIG. 12B indicates that the acoustic energy in confined near the piezoelectric layer 12 at the resonant frequency in the laterally excited bulk acoustic wave device 110.

Figure 12C:
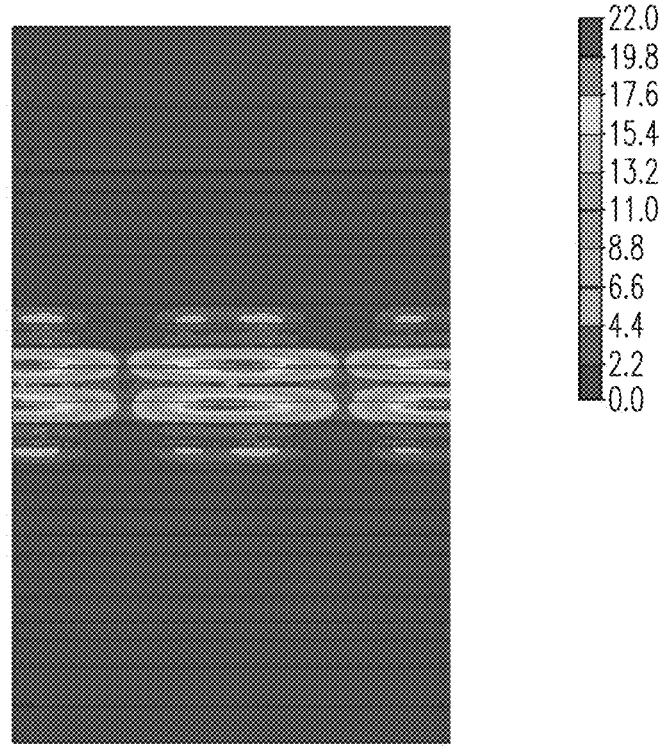
FIG. 12C illustrates displacement at an anti-resonant frequency for the laterally excited bulk acoustic wave device with a double solid acoustic mirror structure of FIG. 11A.

FIG. 12C illustrates displacement at an anti-resonant frequency for the laterally excited bulk acoustic wave device 110 of FIG. 11A. FIG. 12C indicates that the acoustic energy in confined near the piezoelectric layer 12 at the anti-resonant frequency in the laterally excited bulk acoustic wave device 110.

FIG. 12D is a graph corresponding to different thicknesses of the piezoelectric layer for the laterally excited bulk acoustic wave device 110 of FIG. 11A. The different curves correspond to different thicknesses H1 for a lithium niobate piezoelectric layer 12. FIG. 12D indicates that the thickness H1 of the lithium niobate piezoelectric layer 12 can be at least 0.04 L to achieve a preferred electrical performance (e.g., $k^2$). The thickness H1 of lithium niobate piezoelectric layer 12 can be at least 200 nanometers from a fabrication point of view.

Figure 12E:
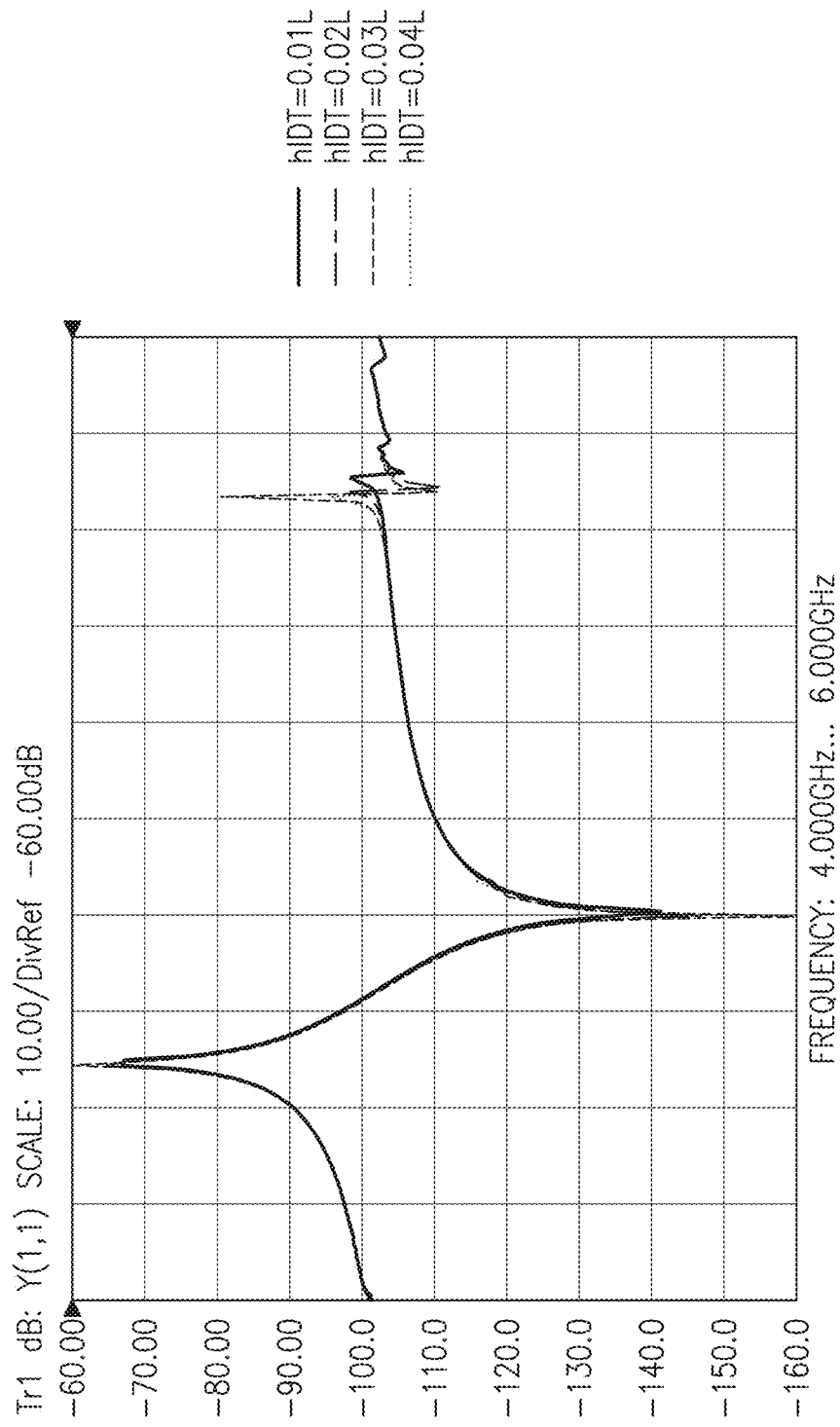
FIG. 12E is a graph corresponding to different thicknesses of the interdigital transducer electrode for the laterally excited bulk acoustic wave device of FIG. 11A.

FIG. 12E is a graph corresponding to different thicknesses of the interdigital transducer electrode for the laterally excited bulk acoustic wave device 110 of FIG. 11A. The different curves correspond to different thicknesses H2 for the IDT electrode layer 14. In the laterally excited bulk acoustic wave device 110, a low impedance layer (e.g., a silicon dioxide layer) overcoats the IDT electrode 14. This can make the laterally excited bulk acoustic wave device 110 robust for IDT electrode thickness H2. The simulations in FIG. 12E do not include the effect of IDT electrode resistivity.

Figure 12F:
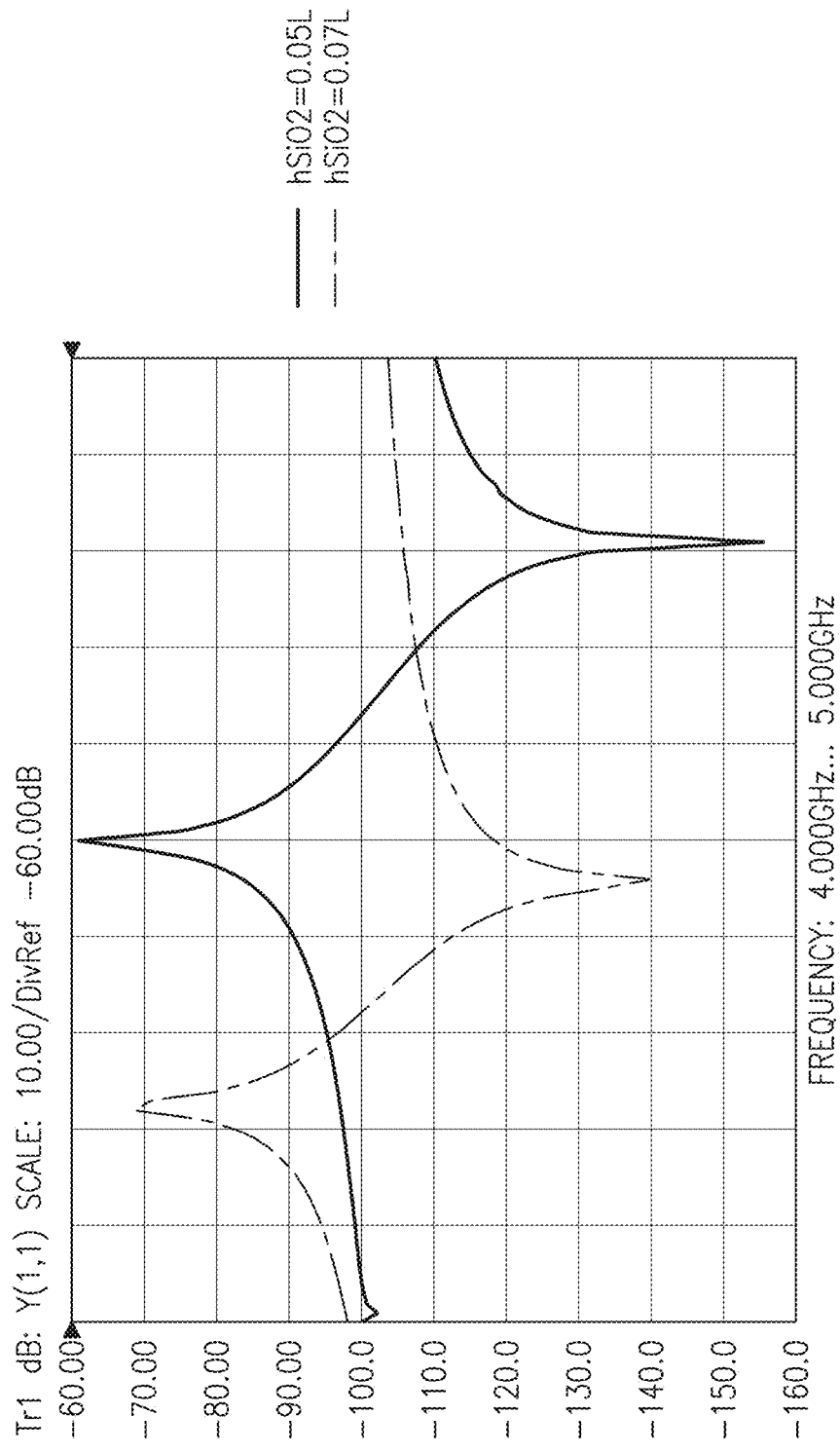
FIG. 12F is a graph corresponding to different thicknesses of a low impedance layer of a solid acoustic mirror over the interdigital transducer electrode for the laterally excited bulk acoustic wave device of FIG. 11A.

FIG. 12F is a graph corresponding to different thicknesses of a silicon dioxide low impedance layer 20A of a solid acoustic mirror 16 over the interdigital transducer electrode 14 for the laterally excited bulk acoustic wave device 110 of FIG. 11A. Height H3 of the low impedance layer 20A in physical contact with the IDT electrode is varied for the different curves in FIG. 12F. Frequency can be adjusted and/or trimmed by changing thickness H3 of the silicon dioxide low impedance layer 20A that is in physical contact with the IDT electrode 14. A range for frequency adjustment and/or trimming can be sufficient to cover series and parallel arms in a ladder type filter.

Figure 13:
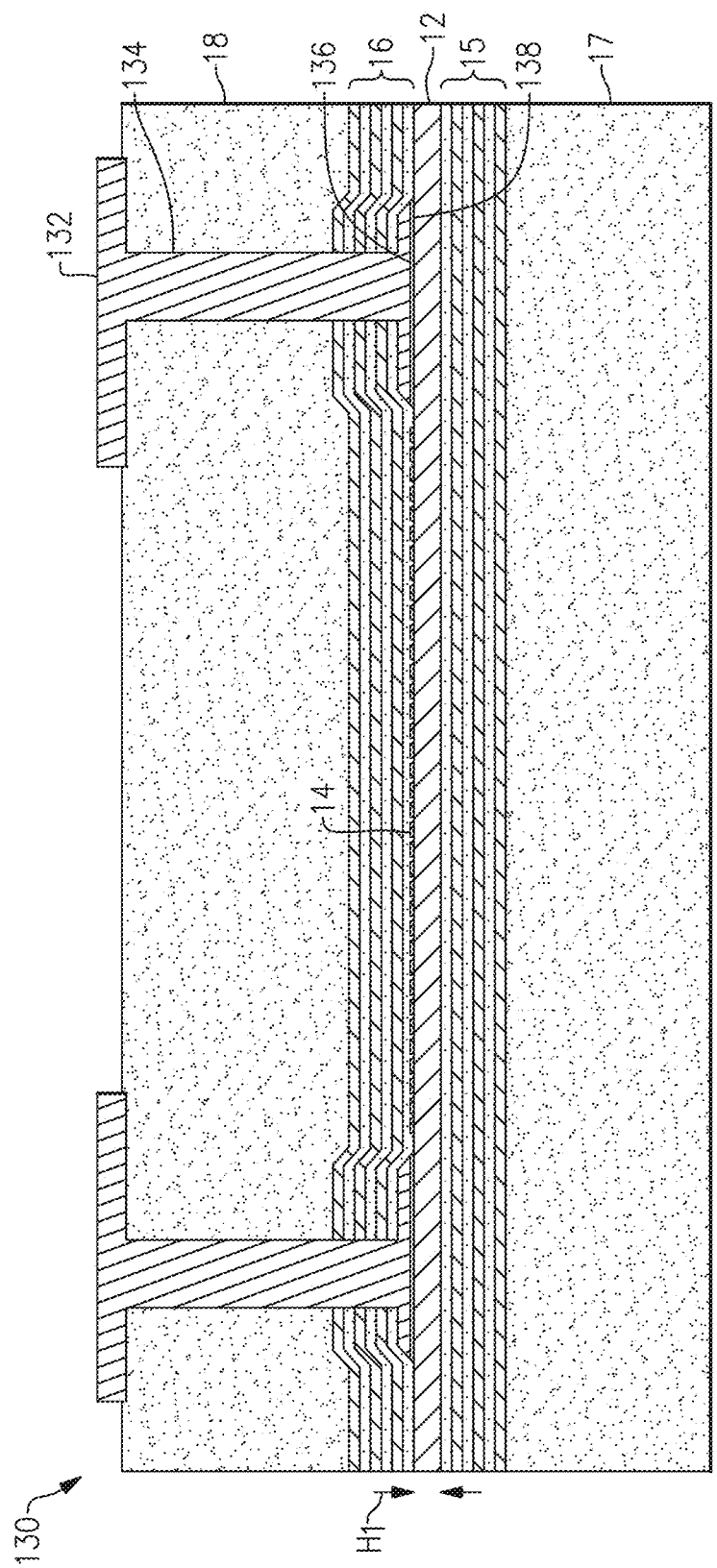
FIG. 13 is a cross sectional diagram of an acoustic wave component with a laterally excited bulk acoustic wave device with a double solid acoustic mirror structure according to an embodiment.

FIG. 13 is a cross sectional diagram of an acoustic wave component 130 with a laterally excited bulk acoustic wave device with a double solid acoustic mirror structure according to an embodiment. The acoustic wave component 130 can be referred to as a laterally excited bulk acoustic wave component. The acoustic wave component 130 includes a first substrate 17, a first solid acoustic mirror 15 on the first substrate 17, a piezoelectric layer 12 on the first solid acoustic mirror 15, an IDT electrode 14 on the piezoelectric layer 12, a second solid acoustic mirror 16 on the piezoelectric layer 12 and the IDT electrode 14, and a second substrate 18 on the second solid acoustic mirror 16. The acoustic wave component 130 also includes input/output contacts 132 and conductive vias 134.

The input/output contacts 132 can be pins, for example. An input/output contact 132 can be electrically connected to one or more laterally excited bulk acoustic wave devices of the acoustic wave component by way of a conductive via 134.

As illustrated, the conductive vias 134 extend through the second substrate 18 and the second solid acoustic mirror 16. In some other instances (not illustrated), one or more conductive vias can extend through the first substrate 17. In such instances, there can be one or more input/output contact on a side of the first substrate 17 opposite to the piezoelectric layer that are electrically connected to the one or more conductive vias.

The acoustic wave component 130 can include a plurality of laterally excited bulk acoustic wave resonators. For example, the acoustic wave component 130 can include 10 to 20 laterally excited bulk acoustic wave resonators. The laterally excited bulk acoustic wave resonators of the acoustic wave component 130 can be included in a single filter or two or more filters.

Figure 14:
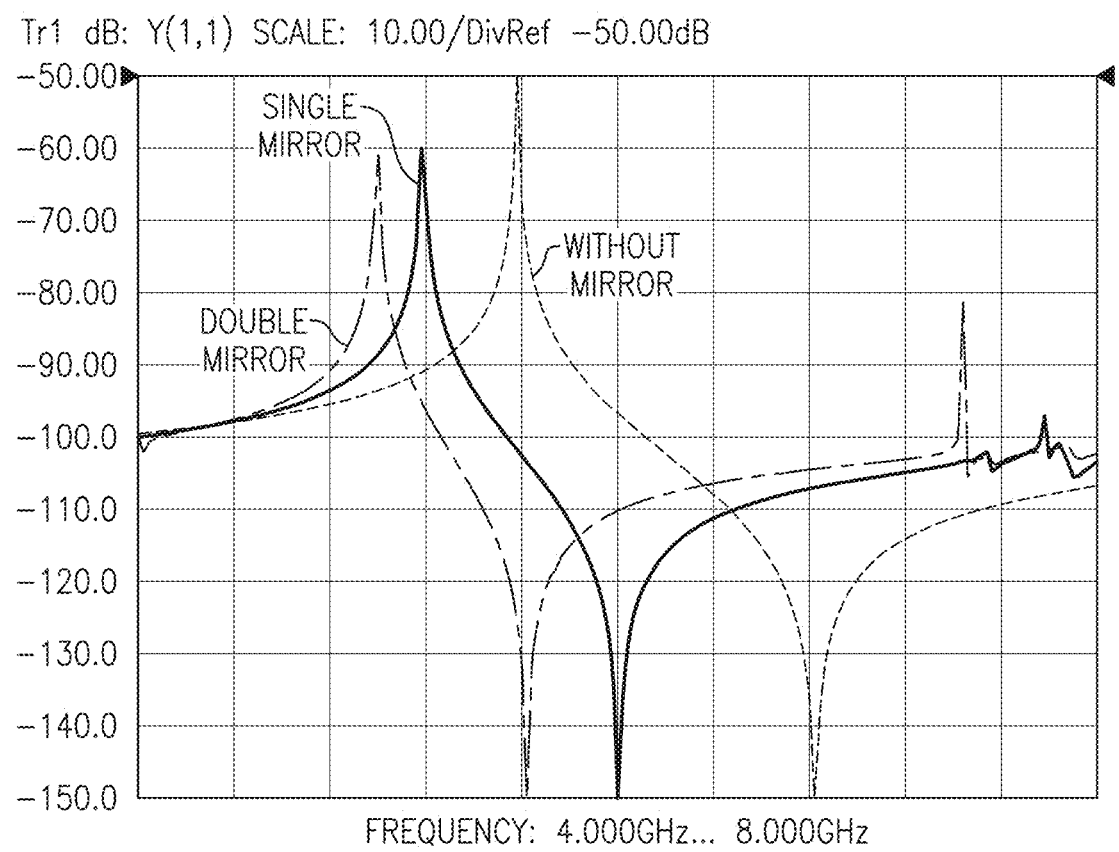
FIG. 14 is a group comparing admittance of the laterally excited bulk acoustic wave devices of FIGS. 2A, 3, and 11A.

FIG. 14 is a group comparing admittance of the laterally excited bulk acoustic wave devices of FIGS. 2A, 3, and 11A. A relatively small amount of acoustic energy in a solid acoustic mirror or solid acoustic mirrors during operation of a laterally excited bulk acoustic wave device can reduce electromechanical coupling coefficient ($k^2$). The electromechanical coupling coefficient can be proportional to the difference between the resonant frequency and the anti-resonant frequency of an acoustic resonator. FIG. 14 indicates that an electromechanical coupling coefficient of about 20% can be achieved with a double mirror laterally exited bulk acoustic wave device. This electromechanical coupling coefficient can still be desirable. For example, this electromechanical coupling coefficient can be higher than for temperature compensated surface acoustic wave resonators. The single mirror laterally exited bulk acoustic wave device can achieve a higher electromechanical coupling coefficient than the double mirror laterally exited bulk acoustic wave device.

FIG. 15 illustrates a thermal simulation result of a laterally excited bulk acoustic wave device with a membrane structure. The laterally excited bulk acoustic wave device with a membrane structure of FIG. 15 includes a piezoelectric layer 12, an IDT electrode 14 on the piezoelectric layer 12, an air cavity 152 under the piezoelectric layer 12, and a support substrate 154. Although not shown in FIG. 15, the support substrate 154 extends below the air cavity 154 such that the air cavity 152 is between a portion of the support substrate 154 and the piezoelectric layer 12. The IDT electrode 14 generates heat during operation. This generated heat dissipates thought the relatively thin piezoelectric layer 12 to the support substrate 154 laterally from the IDT electrode 14. This can cause the piezoelectric layer 12 to heat up to a high temperature. The piezoelectric layer 12 and the IDT electrode 14 are hotter than the maximum value on the temperature scale in the thermal simulation. The thermal simulation indicates that the laterally excited bulk acoustic wave device with a membrane structure can heat up to about 124° C.

FIG. 16 illustrates a thermal simulation result of a laterally excited bulk acoustic wave device with a single solid acoustic mirror structure according to an embodiment. The laterally excited bulk acoustic wave device with the single solid acoustic mirror structure is generally similar to the laterally excited bulk acoustic wave device 28 of FIGS. 2A-2B and the laterally excited bulk acoustic wave device 90 of FIG. 9. Heat can flow as illustrated in FIG. 2B. The IDT electrode 14 generates heat during operation. The thermal simulation indicates that heat is dissipated into the support substrate 17. The highest temperature during operation can be at the IDT electrode 14. The thermal simulation indicates that the laterally excited bulk acoustic wave device with a single solid acoustic mirror can heat up to about 37° C. This is a significant improvement relative to the laterally excited bulk acoustic wave device with a membrane structure of FIG. 15.

Figure 17:
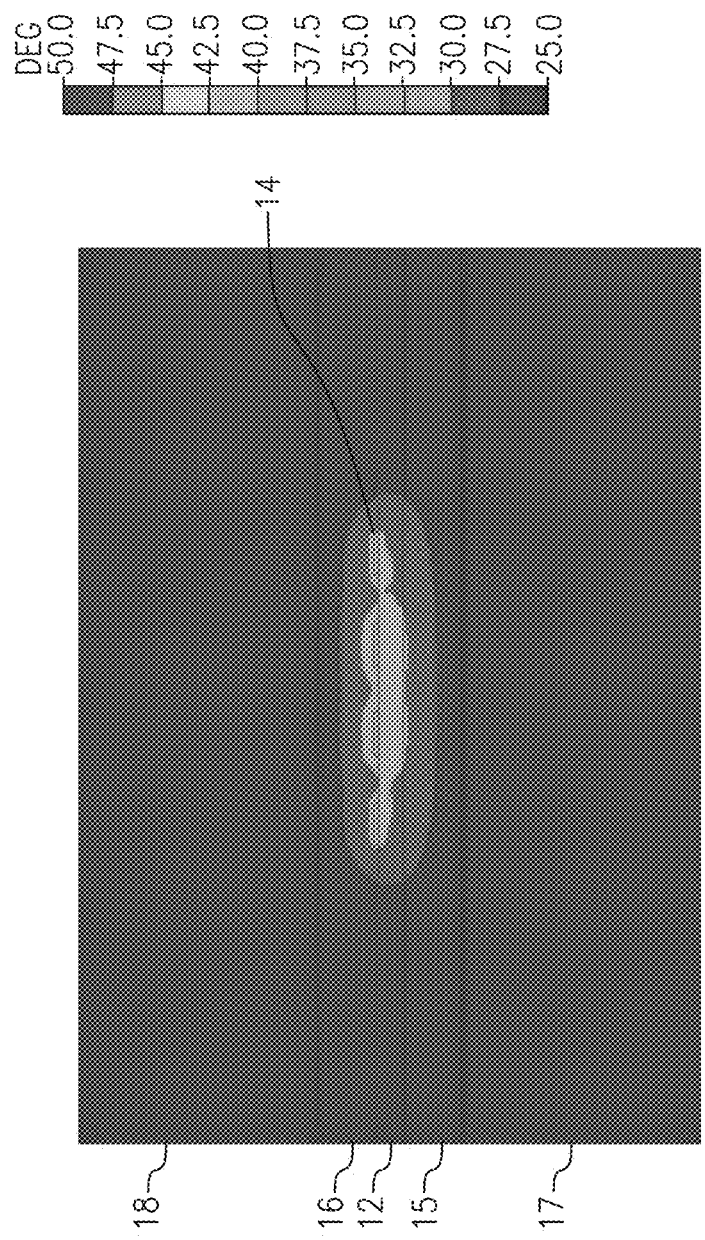
FIG. 17 illustrates a thermal simulation result of a laterally excited bulk acoustic wave device with a double solid acoustic mirror structure according to an embodiment.

FIG. 17 illustrates a thermal simulation result of a laterally excited bulk acoustic wave device with a double solid acoustic mirror structure according to an embodiment. The laterally excited bulk acoustic wave devices with the double solid acoustic mirror structure is generally similar to the laterally excited bulk acoustic wave device 10 of FIGS. 1A-1B and the laterally excited bulk acoustic wave device 110 of FIGS. 11A-11B. Heat can flow as illustrated in FIG. 11B. The IDT electrode 14 generates heat during operation. Heat can be dissipated into support substrates 17 and 18 on opposing sides of the IDT electrode 14. The highest temperature during operation can be at the IDT electrode 14. The thermal simulation of indicates that the laterally excited bulk acoustic wave device with the double solid acoustic mirror can heat up to about 31° C. This is an improvement relative to the laterally excited bulk acoustic wave device with the single solid acoustic mirror of FIG. 16.

Figure 18:
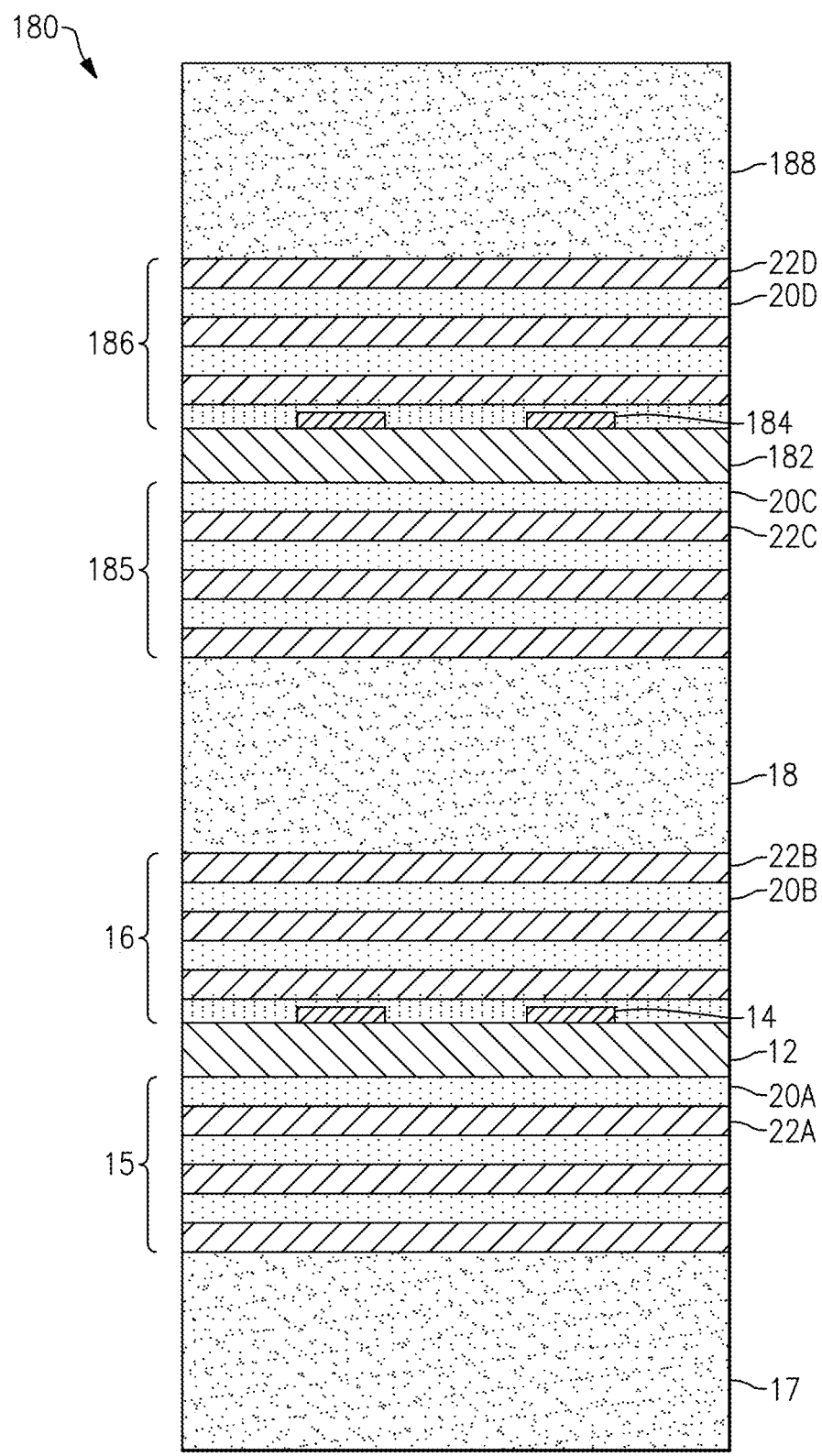
FIG. 18 is a cross sectional diagram of a stacked laterally excited bulk acoustic wave device structure according to an embodiment.

FIG. 18 is a cross sectional diagram of a stacked laterally excited bulk acoustic wave device assembly 180 according to an embodiment. FIG. 18 illustrates that laterally excited bulk acoustic wave devices can be stacked. The stacked laterally excited bulk acoustic wave device assembly 180 can implement a plurality of laterally excited bulk acoustic wave devices in a relatively small sized component. Such a component can have a relatively small vertical height and/or footprint for implementing a plurality of acoustic wave devices.

As illustrated, the stacked laterally excited bulk acoustic wave device assembly 180 includes a first support substrate 17, a first laterally excited bulk acoustic wave stack on the first support substrate 17, a second support substrate 18 positioned on the first laterally excited bulk acoustic wave stack, a second laterally excited bulk acoustic wave stack on the second support substrate 18, and a third substrate 188.

The first laterally excited bulk acoustic wave stack includes a first piezoelectric layer 12, a IDT electrode 14 on the first piezoelectric layer 12, and a first pair of solid acoustic mirrors on opposing sides of the first piezoelectric layer 12. The first pair of solid acoustic mirrors includes a first solid acoustic mirror 15 and a second solid acoustic mirror 16.

The second laterally excited bulk acoustic wave stack includes a second piezoelectric layer 182, a second IDT electrode 184 on the second piezoelectric layer 182, and a second pair of solid acoustic mirrors on opposing sides of the first piezoelectric layer 182. The second pair of second solid acoustic mirrors includes a third solid acoustic mirror 185 and a fourth solid acoustic mirror 186. The second piezoelectric layer 182 can be implemented in accordance with any suitable principles and advantages of the piezoelectric layers disclosed herein. The second IDT electrode 184 can be implemented in accordance with any suitable principles and advantages of the IDT electrodes disclosed herein. The solid acoustic mirrors 185 and 186 include respective low impedance layers 20C and 20D and respective high impedance layers 22C and 22D. The solid acoustic mirrors 185 and 186 can be implemented in accordance with any suitable principles and advantages of the solid acoustic mirrors disclosed herein. The third substrate 188 can be implemented in accordance with any suitable principles and advantages of the substrates disclosed herein.

In the stacked laterally excited bulk acoustic wave device assembly 180, the second support substrate 18 is implemented as a single support substrate between solid acoustic mirrors of the laterally excited bulk acoustic wave stacks. The substrates 17, 18, and 188 can each include the same material in certain applications. Two or more of the substrates 17, 18, and 188 can include different materials in some other applications.

The stacked laterally excited bulk acoustic wave device assembly 180 can include devices of one or more filters arranged to filter RF signals. The first laterally excited bulk acoustic wave stack and the second laterally excited bulk acoustic wave stack can implement devices in the same filter in certain applications. The first laterally excited bulk acoustic wave stack and the second laterally excited bulk acoustic wave stack can implement devices in different filter in various applications. In some such applications, the different filters can be included in a multiplexer.

Although two devices are stacked in FIG. 18, three or more laterally excited bulk acoustic wave devices can be stacked in some other applications. Moreover, although two double mirror laterally excited bulk acoustic devices are shown in FIG. 18, a single mirror laterally excited bulk acoustic device can be stacked on a double mirror laterally excited bulk acoustic devices in some other applications.

Figure 19:
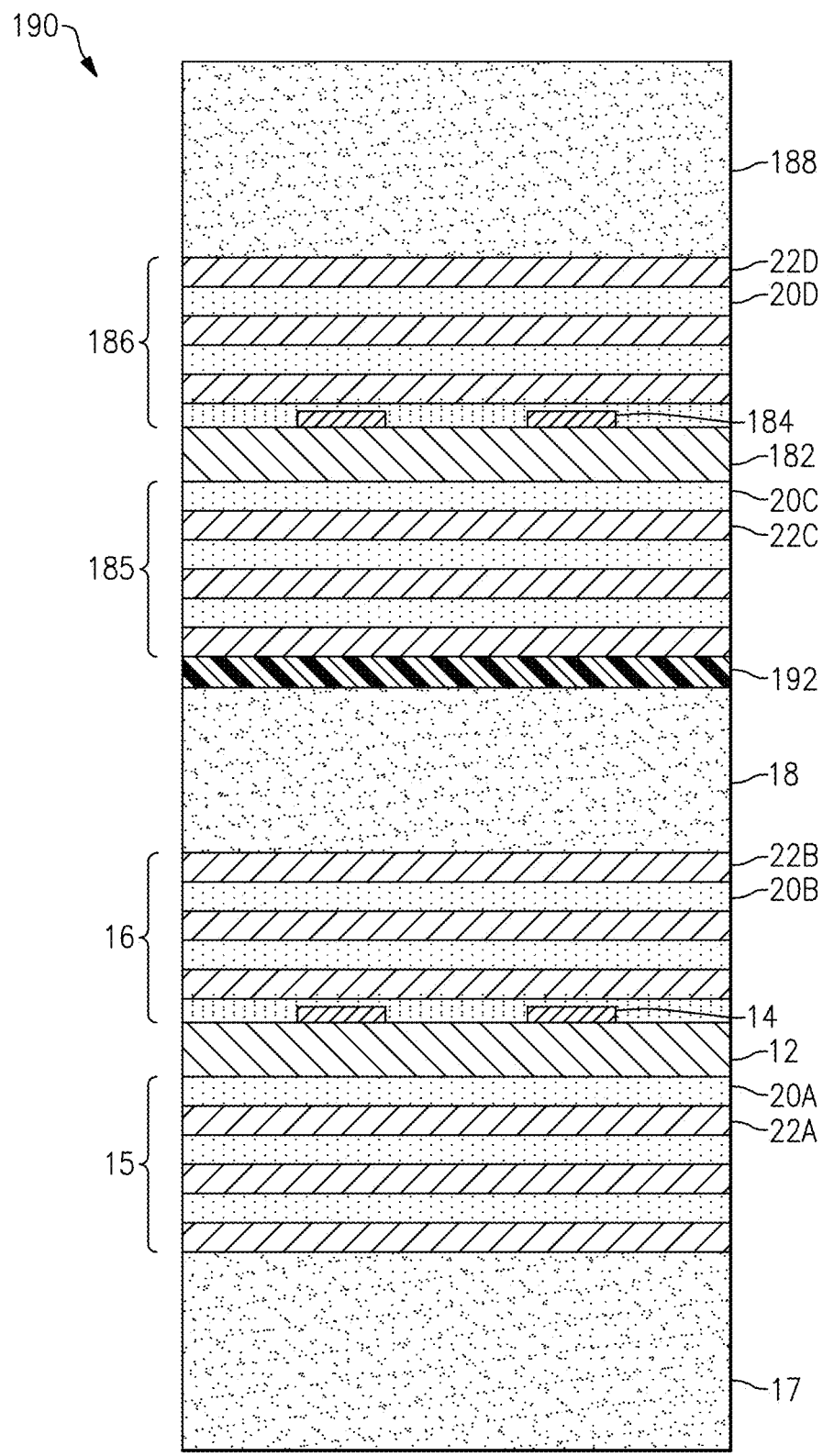
FIG. 19 is a cross sectional diagram of a stacked laterally excited bulk acoustic wave device structure according to another embodiment.

FIG. 19 is a cross sectional diagram of a stacked laterally excited bulk acoustic wave device assembly 190 according to another embodiment. With stacked structures, firm mechanical connections may not be needed. Accordingly, an adhesion layer can be implemented between layers. The stacked laterally excited bulk acoustic wave device assembly 190 is like the stacked laterally excited bulk acoustic wave device assembly 180 of FIG. 18, except that an adhesion layer 192 is included in the stacked laterally excited bulk acoustic wave device assembly 190. The adhesion layer 192 can be an epoxy layer. The adhesion layer 192 can be any other suitable layer arranged to increase adhesion between the second substrate 18 and the third solid acoustic mirror 185.

Figure 20:
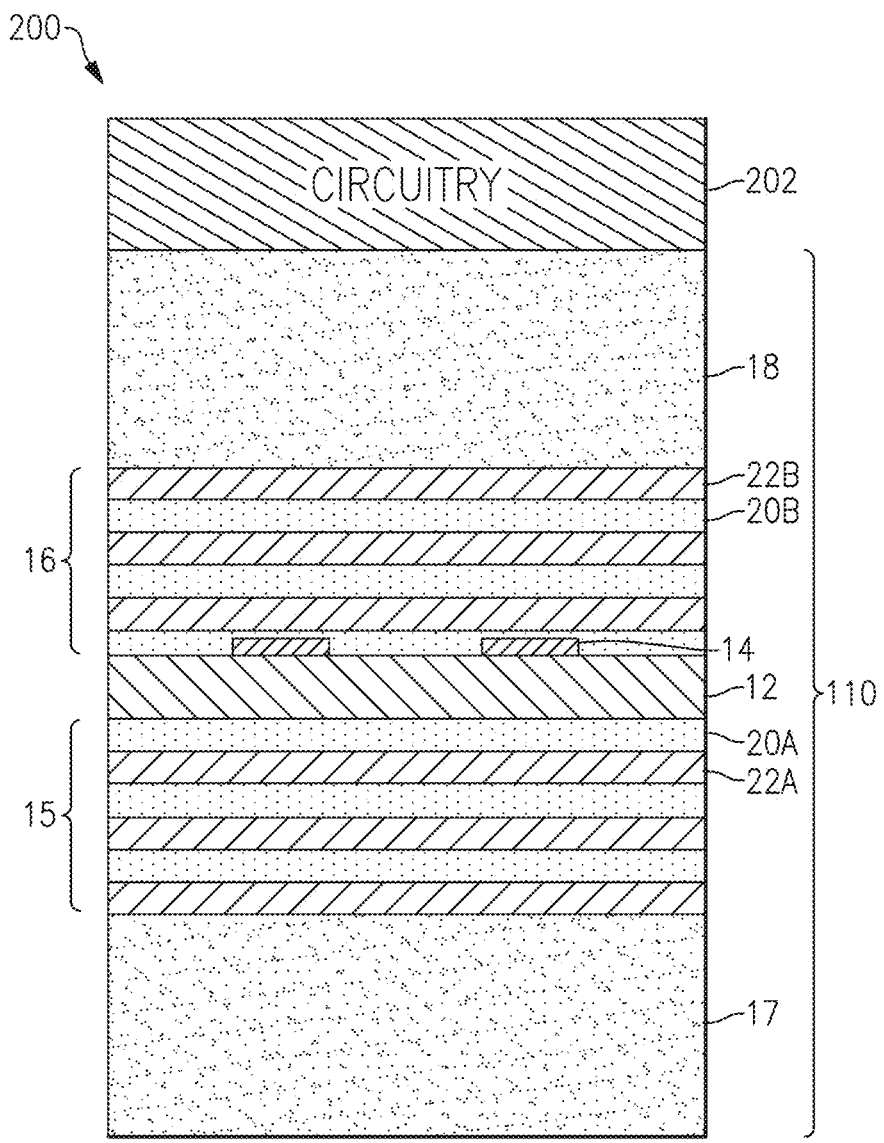
FIG. 20 is a cross sectional diagram of a stacked device structure with a laterally excited bulk acoustic wave device structure stacked with other circuitry according to another embodiment.

A laterally excited bulk acoustic wave can be stacked with other circuitry. FIG. 20 is a cross sectional diagram of a stacked device assembly 200 with a laterally excited bulk acoustic wave device 110 stacked with other circuitry 202 according to another embodiment. As shown in FIG. 20, other circuitry 202 can be implemented on the second substrate 18. Implementing the other circuitry 202 on the second substrate 18 can enable more integration of electrical components in a module. This can reduce physical size of the module.

The second substrate 18 can be a semiconductor substrate. The second substrate 18 can be a silicon substrate. A variety of other circuitry 202 can be implemented on such a second substrate 18. The other circuitry 202 can include one or more transistors, one or more passive impedance elements, one or more other acoustic wave devices, the like, or any suitable combination thereof.

For example, the other circuitry 202 can include one or more transistors, such as one or more of a semiconductor-on-insulator transistor, a silicon-on-insulator transistor, a complementary metal oxide semiconductor transistor, or the like.

Alternatively or additionally, the other circuitry can include one or more passive impedance elements, such as one or more of a capacitor, an inductor, a resistor, a transformer, or a diode. In certain instances, a filter can include the laterally excited bulk acoustic wave device 110 and an inductor capacitor circuit of the other circuitry.

As one more example, the other circuitry can include an acoustic wave device on the second substrate 18. Such an acoustic wave device, can a surface acoustic wave device such as a multi-layer piezoelectric substrate surface acoustic wave device, a bulk acoustic wave device such as a film bulk acoustic wave resonator or s solidly mounted resonator, a boundary wave device, or the like. The laterally excited bulk acoustic wave device 110 can be included in the same filter as the acoustic wave device of the other circuitry 202. Alternatively, the laterally excited bulk acoustic wave device 110 can be included in a different filter as the acoustic wave device of the other circuitry 202. The different filters can be included in a multiplexer in some instances.

One or more vias and/or other conductive structures (not shown) in the stacked device assembly 200 can provide an electrical connection between the laterally excited bulk acoustic wave device 110 and the other circuitry 202. Such electrical connections in the stacked device assembly 200 can reduce an impact of electrical connections between the laterally excited bulk acoustic wave device 110.

Acoustic wave devices disclosed herein can be implemented in a variety of different filter topologies. Example filter topologies include without limitation, ladder filters, lattice filters, hybrid ladder lattice filters, filters that include ladder stages and a multi-mode surface acoustic wave filter, and the like. Such filters can be band pass filters. In some other applications, such filters include band stop filters. In some instances, acoustic wave devices disclosed herein can be implemented in filters with one or more other types of resonators and/or with passive impedance elements, such as one or more inductors and/or one or more capacitors. Some example filter topologies will now be discussed with reference to FIGS. 21 to 23. Any suitable combination of features of the filter topologies of FIGS. 21 to 23 can be implemented together with each other and/or with other filter topologies.

Figure 21:
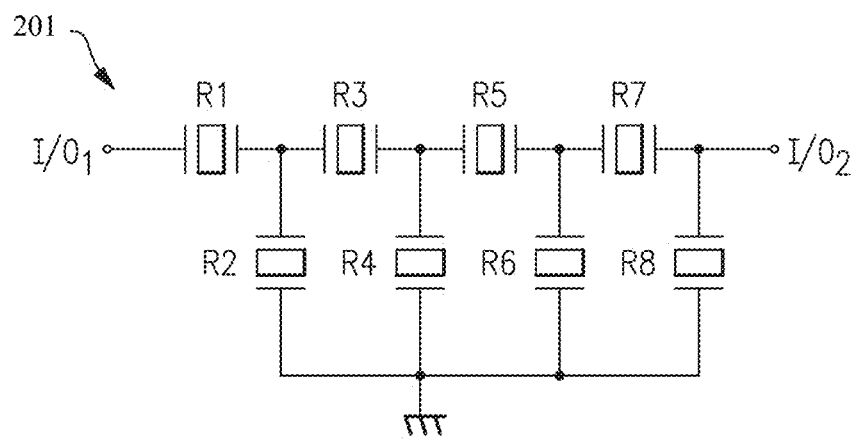
FIG. 21 is a schematic diagram of a ladder filter that includes a laterally excited bulk acoustic wave resonator according to an embodiment.

FIG. 21 is a schematic diagram of a ladder filter 201 that includes a laterally excited bulk acoustic wave resonator according to an embodiment. The ladder filter 201 is an example topology that can implement a band pass filter formed from acoustic wave resonators. In a band pass filter with a ladder filter topology, the shunt resonators can have lower resonant frequencies than the series resonators. The ladder filter 201 can be arranged to filter a radio frequency signal. As illustrated, the ladder filter 201 includes series acoustic wave resonators R1 R3, R5, and R7 and shunt acoustic wave resonators R2, R4, R6, and R8 coupled between a first input/output port I/O$_1$ and a second input/output port I/O$_2$. Any suitable number of series acoustic wave resonators can be included in a ladder filter. Any suitable number of shunt acoustic wave resonators can be included in a ladder filter.

One or more of the acoustic wave resonators of the ladder filter 201 can include a laterally excited bulk acoustic wave filter according to an embodiment. In certain applications, all acoustic resonators of the ladder filter 201 can be laterally excited bulk acoustic wave resonators in accordance with any suitable principles and advantages disclosed herein. According to some applications, the ladder filter 201 can include at least one laterally excited bulk acoustic wave device according to one embodiment and at least one other laterally excited bulk acoustic wave device according to another embodiment.

The first input/output port I/O$_1$ can a transmit port and the second input/output port I/O$_2$ can be an antenna port. Alternatively, first input/output port I/O$_1$ can a receive port and the second input/output port I/O$_2$ can be an antenna port.

Figure 22:
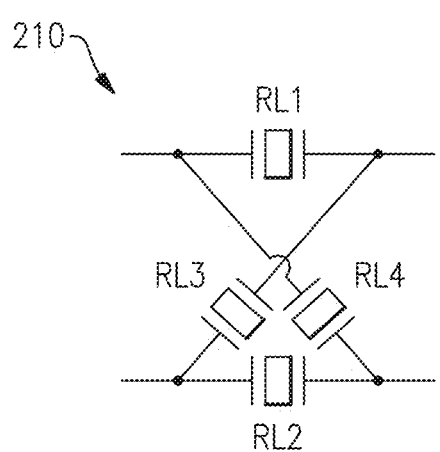
FIG. 22 is a schematic diagram of a lattice filter that includes a laterally excited bulk acoustic wave resonator according to an embodiment.

FIG. 22 is a schematic diagram of a lattice filter 210 that includes a laterally excited bulk acoustic wave resonator according to an embodiment. The lattice filter 210 is an example topology of a band pass filter formed from acoustic wave resonators. The lattice filter 210 can be arranged to filter an RF signal. As illustrated, the lattice filter 210 includes acoustic wave resonators RL1, RL2, RL3, and RL4. The acoustic wave resonators RL1 and RL2 are series resonators. The acoustic wave resonators RL3 and RL4 are shunt resonators. The illustrated lattice filter 210 has a balanced input and a balanced output. One or more of the illustrated acoustic wave resonators RL1 to RL4 can be a laterally excited bulk acoustic wave resonator in accordance with any suitable principles and advantages disclosed herein.

Figure 23:
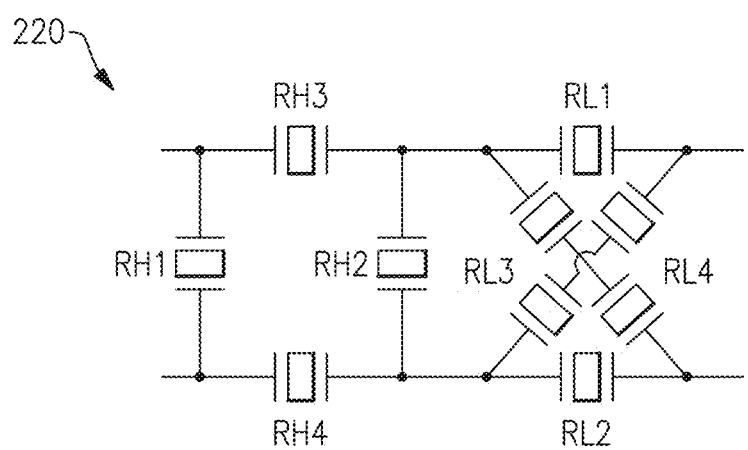
FIG. 23 is a schematic diagram of a hybrid ladder lattice filter that includes a laterally excited bulk acoustic wave resonator according to an embodiment.

FIG. 23 is a schematic diagram of a hybrid ladder and lattice filter 220 that includes a laterally excited bulk acoustic wave resonator according to an embodiment. The illustrated hybrid ladder and lattice filter 220 includes series acoustic resonators RL1, RL2, RH3, and RH4 and shunt acoustic resonators RL3, RL4, RH1, and RH2. The hybrid ladder and lattice filter 220 includes one or more laterally excited bulk acoustic wave resonators in accordance with any suitable principles and advantages disclosed herein. For example, the series resonators RL1, RL2, RH3, and RH4 and the shunt resonators RL3, RL4, RH1, and RH2 can each be a laterally excited bulk acoustic wave resonator according to an embodiment.

According to certain applications, a laterally excited bulk acoustic wave resonator can be included in filter that also includes one or more inductors and one or more capacitors.

The laterally excited bulk acoustic wave resonators disclosed herein can be implemented in a standalone filter and/or in a filter in any suitable multiplexer. Such filters can be any suitable topology, such as any filter topology of FIGS. 21 to 23. The filter can be a band pass filter arranged to filter a 4G LTE band and/or 5G NR band. Examples of a standalone filter and multiplexers will be discussed with reference to FIGS. 24A to 24E. Any suitable principles and advantages of these filters and/or multiplexers can be implemented together with each other.

Figure 24A:
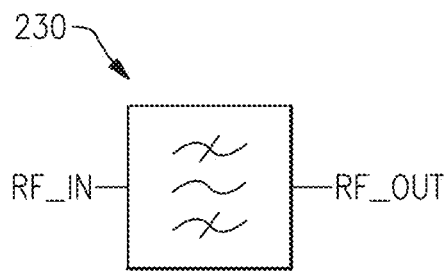
FIG. 24A is a schematic diagram of an acoustic wave filter.

FIG. 24A is schematic diagram of an acoustic wave filter 230. The acoustic wave filter 230 is a band pass filter. The acoustic wave filter 230 is arranged to filter a radio frequency. The acoustic wave filter 230 includes one or more acoustic wave devices coupled between a first input/output port RF_IN and a second input/output port RF OUT. The acoustic wave filter 230 includes a laterally excited bulk acoustic wave resonator according to an embodiment.

Figure 24B:
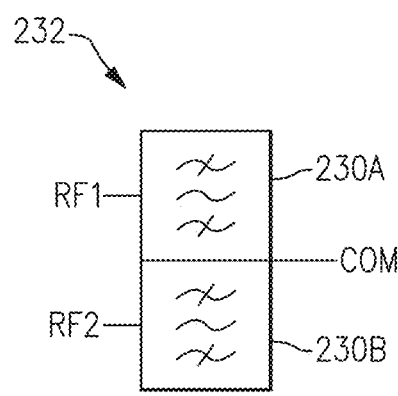
FIG. 24B is a schematic diagram of a duplexer.

FIG. 24B is a schematic diagram of a duplexer 232 that includes an acoustic wave filter according to an embodiment. The duplexer 232 includes a first filter 230A and a second filter 230B coupled to together at a common node COM. One of the filters of the duplexer 232 can be a transmit filter and the other of the filters of the duplexer 232 can be a receive filter. In some other instances, such as in a diversity receive application, the duplexer 232 can include two receive filters. Alternatively, the duplexer 232 can include two transmit filters. The common node COM can be an antenna node.

The first filter 230A is an acoustic wave filter arranged to filter a radio frequency signal. The first filter 230A includes one or more acoustic wave resonators coupled between a first radio frequency node RF1 and the common node COM. The first radio frequency node RF1 can be a transmit node or a receive node. The first filter 230A includes a laterally excited bulk acoustic wave resonator in accordance with any suitable principles and advantages disclosed herein.

The second filter 230B can be any suitable filter arranged to filter a second radio frequency signal. The second filter 230B can be, for example, an acoustic wave filter, an acoustic wave filter that includes a laterally exited bulk acoustic wave resonator, an LC filter, a hybrid acoustic wave LC filter, or the like. The second filter 230B is coupled between a second radio frequency node RF2 and the common node. The second radio frequency node RF2 can be a transmit node or a receive node Although example embodiments may be discussed with filters or duplexers for illustrative purposes, any suitable principles and advantages disclosed herein can be implement in a multiplexer that includes a plurality of filters coupled together at a common node. Examples of multiplexers include but are not limited to a duplexer with two filters coupled together at a common node, a triplexer with three filters coupled together at a common node, a quadplexer with four filters coupled together at a common node, a hexaplexer with six filters coupled together at a common node, an octoplexer with eight filters coupled together at a common node, or the like. Multiplexers can include filters having different passbands. Multiplexers can include any suitable number of transmit filters and any suitable number of receive filters. For example, a multiplexer can include all receive filters, all transmit filters, or one or more transmit filters and one or more receive filters. One or more filters of a multiplexer can include any suitable number of laterally excited bulk acoustic wave devices.

Figure 24C:
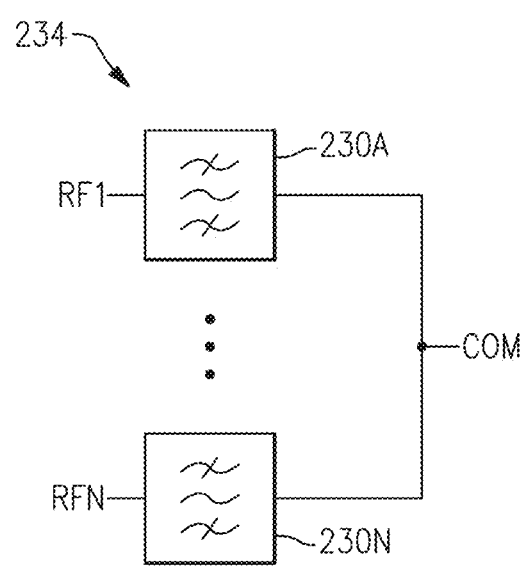
FIG. 24C is a schematic diagram of a multiplexer with hard multiplexing.

FIG. 24C is a schematic diagram of a multiplexer 234 that includes an acoustic wave filter according to an embodiment. The multiplexer 234 includes a plurality of filters 230A to 230N coupled together at a common node COM. The plurality of filters can include any suitable number of filters including, for example, 3 filters, 4 filters, 5 filters, 6 filters, 7 filters, 8 filters, or more filters. Some or all of the plurality of acoustic wave filters can be acoustic wave filters. As illustrated, the filters 230A to 230N each have a fixed electrical connection to the common node COM. This can be referred to as hard multiplexing or fixed multiplexing. Filters have fixed electrical connections to the common node in hard multiplexing applications.

The first filter 230A is an acoustic wave filter arranged to filter a radio frequency signal. The first filter 230A can include one or more acoustic wave devices coupled between a first radio frequency node RF1 and the common node COM. The first radio frequency node RF1 can be a transmit node or a receive node. The first filter 230A includes a laterally excited bulk acoustic wave resonator in accordance with any suitable principles and advantages disclosed herein. The other filter(s) of the multiplexer 234 can include one or more acoustic wave filters, one or more acoustic wave filters that include a laterally excited bulk acoustic wave resonator, one or more LC filters, one or more hybrid acoustic wave LC filters, or any suitable combination thereof.

Figure 24D:
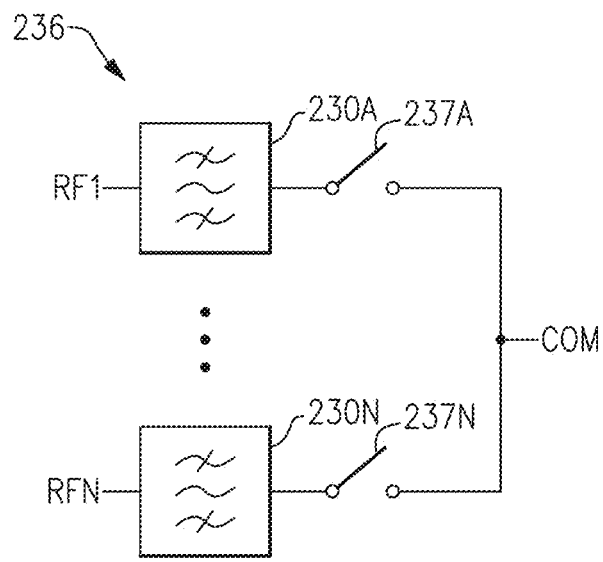
FIG. 24D is a schematic diagram of a multiplexer with switched multiplexing.

FIG. 24D is a schematic diagram of a multiplexer 236 that includes an acoustic wave filter according to an embodiment. The multiplexer 236 is like the multiplexer 234 of FIG. 24C, except that the multiplexer 236 implements switched multiplexing. In switched multiplexing, a filter is coupled to a common node via a switch. In the multiplexer 236, the switch 237A to 237N can selectively electrically connect respective filters 230A to 230N to the common node COM. For example, the switch 237A can selectively electrically connect the first filter 230A the common node COM via the switch 237A. Any suitable number of the switches 237A to 237N can electrically a respective filters 230A to 230N to the common node COM in a given state. Similarly, any suitable number of the switches 237A to 237N can electrically isolate a respective filter 230A to 230N to the common node COM in a given state. The functionality of the switches 237A to 237N can support various carrier aggregations.

Figure 24E:
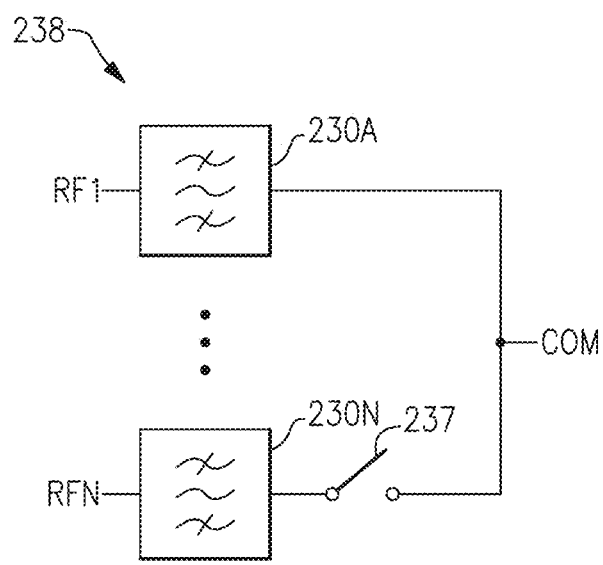
FIG. 24E is a schematic diagram of a multiplexer with a combination of hard multiplexing and switched multiplexing.

FIG. 24E is a schematic diagram of a multiplexer 238 that includes an acoustic wave filter according to an embodiment. The multiplexer 238 illustrates that a multiplexer can include any suitable combination of hard multiplexed and switched multiplexed filters. One or more laterally excited bulk acoustic wave devices can be included in a filter that is hard multiplexed to the common node of a multiplexer. Alternatively or additionally, one or more laterally excited bulk acoustic wave devices can be included in a filter that is switch multiplexed to the common node of a multiplexer The acoustic wave devices disclosed herein can be implemented in a variety of packaged modules. Some example packaged modules will now be disclosed in which any suitable principles and advantages of the acoustic wave devices, acoustic wave components, or stacked acoustic wave device assemblies disclosed herein can be implemented. The example packaged modules can include a package that encloses the illustrated circuit elements. A module that includes a radio frequency component can be referred to as a radio frequency module. The illustrated circuit elements can be disposed on a common packaging substrate. The packaging substrate can be a laminate substrate, for example. FIGS. 25 to 29 are schematic block diagrams of illustrative packaged modules according to certain embodiments. Any suitable combination of features of these packaged modules can be implemented with each other. While duplexers are illustrated in the example packaged modules of FIGS. 26, 27, and 29, any other suitable multiplexer that includes a plurality of filters coupled to a common node and/or standalone filter can be implemented instead of one or more duplexers. For example, a quadplexer can be implemented in certain applications. As another example, one or more filters of a packaged module can be arranged as a transmit filter or a receive filter that is not included in a multiplexer.

Figure 25:
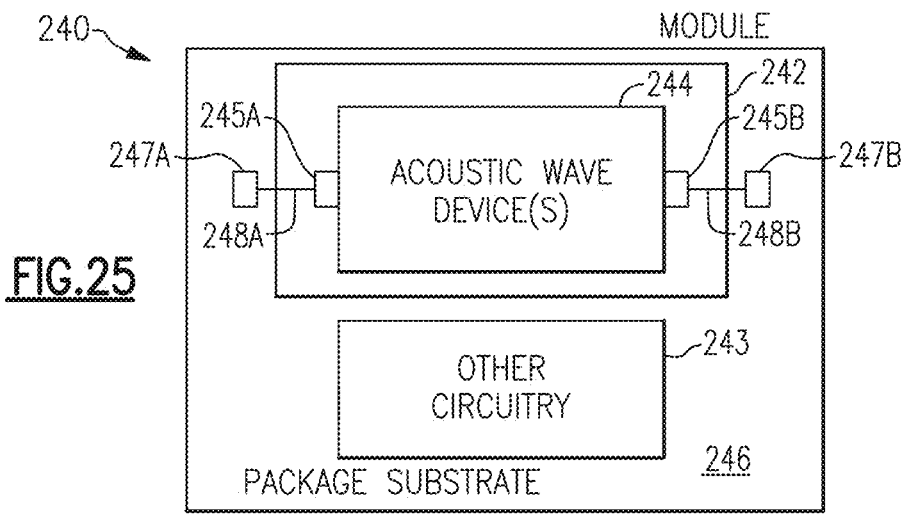
FIG. 25 is a schematic diagram of a radio frequency module that includes an acoustic wave filter according to an embodiment.

FIG. 25 is a schematic diagram of a radio frequency module 240 that includes an acoustic wave component 242 according to an embodiment. The illustrated radio frequency module 240 includes the acoustic wave component 242 and other circuitry 243. The acoustic wave component 242 can include one or more acoustic wave devices in accordance with any suitable combination of features of the acoustic wave filters disclosed herein. The acoustic wave component 242 can include an acoustic wave filter that includes a plurality of laterally excited bulk acoustic wave resonators, for example.

The acoustic wave component 242 shown in FIG. 25 includes one or more acoustic wave devices 244 and terminals 245A and 245B. The one or more acoustic wave devices 244 includes an acoustic wave device implemented in accordance with any suitable principles and advantages disclosed herein. The terminals 245A and 244B can serve, for example, as an input contact and an output contact. Although two terminals are illustrated, any suitable number of terminals can be implemented for a particular application. The acoustic wave component 242 and the other circuitry 243 are on a common packaging substrate 246 in FIG. 25. The package substrate 246 can be a laminate substrate. The terminals 245A and 245B can be electrically connected to contacts 247A and 247B, respectively, on the packaging substrate 246 by way of electrical connectors 248A and 248B, respectively. The electrical connectors 248A and 248B can be bumps or wire bonds, for example.

The other circuitry 243 can include any suitable additional circuitry. For example, the other circuitry can include one or more radio frequency amplifiers (e.g., one or more power amplifiers and/or one or more low noise amplifiers), one or more radio frequency switches, one or more additional filters, one or more RF couplers, one or more delay lines, one or more phase shifters, the like, or any suitable combination thereof. The other circuitry 243 can be electrically connected to the one or more acoustic wave devices 244. The radio frequency module 240 can include one or more packaging structures to, for example, provide protection and/or facilitate easier handling of the radio frequency module 240. Such a packaging structure can include an overmold structure formed over the packaging substrate 246. The overmold structure can encapsulate some or all of the components of the radio frequency module 240.

Figure 26:
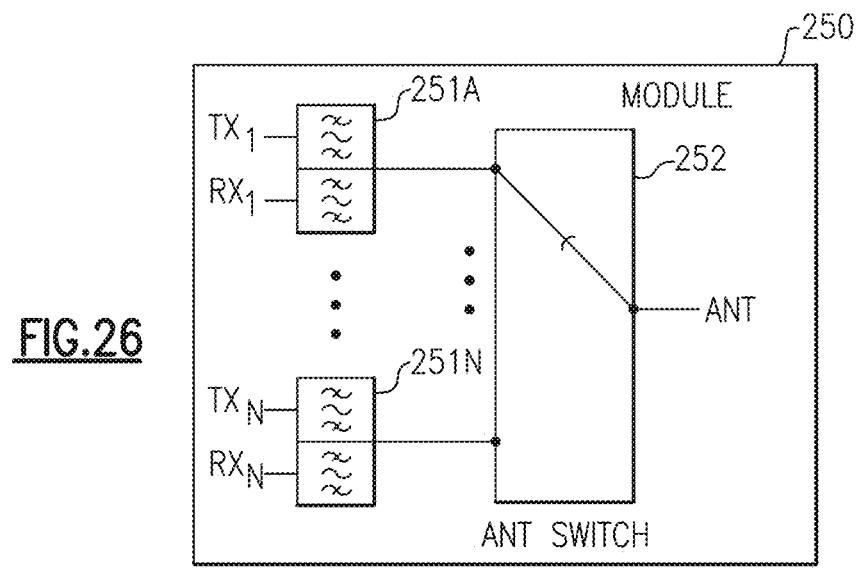
FIG. 26 is a schematic block diagram of a module that includes an antenna switch and duplexers according to an embodiment.

FIG. 26 is a schematic block diagram of a module 250 that includes duplexers 251A to 251N and an antenna switch 252. One or more filters of the duplexers 251A to 251N can include an acoustic wave device in accordance with any suitable principles and advantages disclosed herein. Any suitable number of duplexers 251A to 251N can be implemented. The antenna switch 252 can have a number of throws corresponding to the number of duplexers 251A to 251N. The antenna switch 252 can include one or more additional throws coupled to one or more filters external to the module 250 and/or coupled to other circuitry. The antenna switch 252 can electrically couple a selected duplexer to an antenna port of the module 250.

Figure 27:
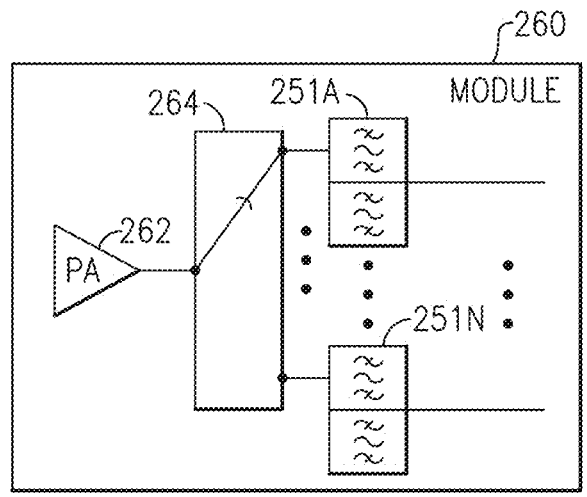
FIG. 27 is a schematic block diagram of a module that includes a power amplifier, a radio frequency switch, and duplexers according to an embodiment.

FIG. 27 is a schematic block diagram of a module 260 that includes a power amplifier 262, a radio frequency switch 264, and duplexers 251A to 251N according to an embodiment. The power amplifier 262 can amplify a radio frequency signal. The radio frequency switch 264 can be a multi-throw radio frequency switch. The radio frequency switch 264 can electrically couple an output of the power amplifier 262 to a selected transmit filter of the duplexers 251A to 251N. One or more filters of the duplexers 251A to 251N can include an acoustic wave device in accordance with any suitable principles and advantages disclosed herein. Any suitable number of duplexers 251A to 251N can be implemented.

Figure 28:
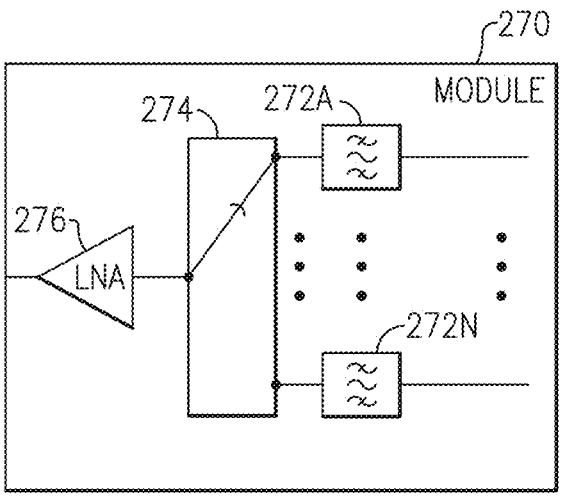
FIG. 28 is a schematic block diagram of a module that includes a low noise amplifier, a radio frequency switch, and filters according to an embodiment.

FIG. 28 is a schematic block diagram of a module 270 that includes filters 272A to 272N, a radio frequency switch 274, and a low noise amplifier 276 according to an embodiment. One or more filters of the filters 272A to 272N can include any suitable number of acoustic wave devices in accordance with any suitable principles and advantages disclosed herein. Any suitable number of filters 272A to 272N can be implemented. The illustrated filters 272A to 272N are receive filters. In some embodiments (not illustrated), one or more of the filters 272A to 272N can be included in a multiplexer that also includes a transmit filter. The radio frequency switch 274 can be a multi-throw radio frequency switch. The radio frequency switch 274 can electrically couple an output of a selected filter of filters 272A to 272N to the low noise amplifier 276. In some embodiments (not illustrated), a plurality of low noise amplifiers can be implemented. The module 270 can include diversity receive features in certain applications.

Figure 29:
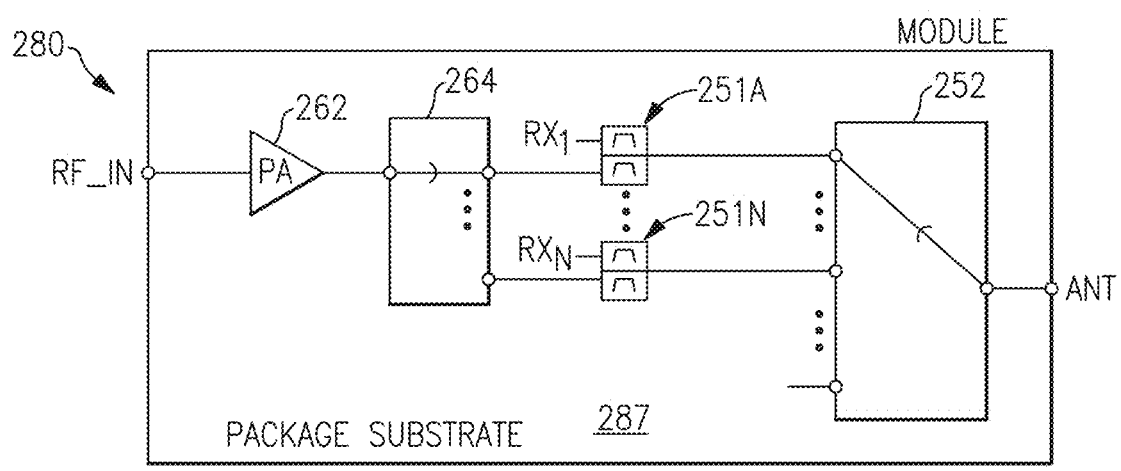
FIG. 29 is a schematic diagram of a radio frequency module that includes an acoustic wave filter according to an embodiment.

FIG. 29 is a schematic diagram of a radio frequency module 280 that includes an acoustic wave filter according to an embodiment. As illustrated, the radio frequency module 280 includes duplexers 251A to 251N, a power amplifier 262, a select switch 264, and an antenna switch 252. The radio frequency module 280 can include a package that encloses the illustrated elements. The illustrated elements can be disposed on a common packaging substrate 287. The packaging substrate 287 can be a laminate substrate, for example. A radio frequency module that includes a power amplifier can be referred to as a power amplifier module. A radio frequency module can include a subset of the elements illustrated in FIG. 29 and/or additional elements. The radio frequency module 280 may include any one of the acoustic wave filters in accordance with any suitable principles and advantages disclosed herein.

The duplexers 251A to 251N can each include two acoustic wave filters coupled to a common node. For example, the two acoustic wave filters can be a transmit filter and a receive filter. As illustrated, the transmit filter and the receive filter can each be a band pass filter arranged to filter a radio frequency signal. One or more of the transmit filters can include an acoustic wave device in accordance with any suitable principles and advantages disclosed herein. Similarly, one or more of the receive filters can include an acoustic wave device in accordance with any suitable principles and advantages disclosed herein. Although FIG. 29 illustrates duplexers, any suitable principles and advantages disclosed herein can be implemented in other multiplexers (e.g., quadplexers, hexaplexers, octoplexers, etc.) and/or in switch-plexers and/or with standalone filters.

The power amplifier 262 can amplify a radio frequency signal. The illustrated switch 264 is a multi-throw radio frequency switch. The switch 264 can electrically couple an output of the power amplifier 262 to a selected transmit filter of the transmit filters of the duplexers 251A to 251N. In some instances, the switch 264 can electrically connect the output of the power amplifier 262 to more than one of the transmit filters. The antenna switch 252 can selectively couple a signal from one or more of the duplexers 251A to 251N to an antenna port ANT. The duplexers 251A to 251N can be associated with different frequency bands and/or different modes of operation (e.g., different power modes, different signaling modes, etc.).

Figure 30:
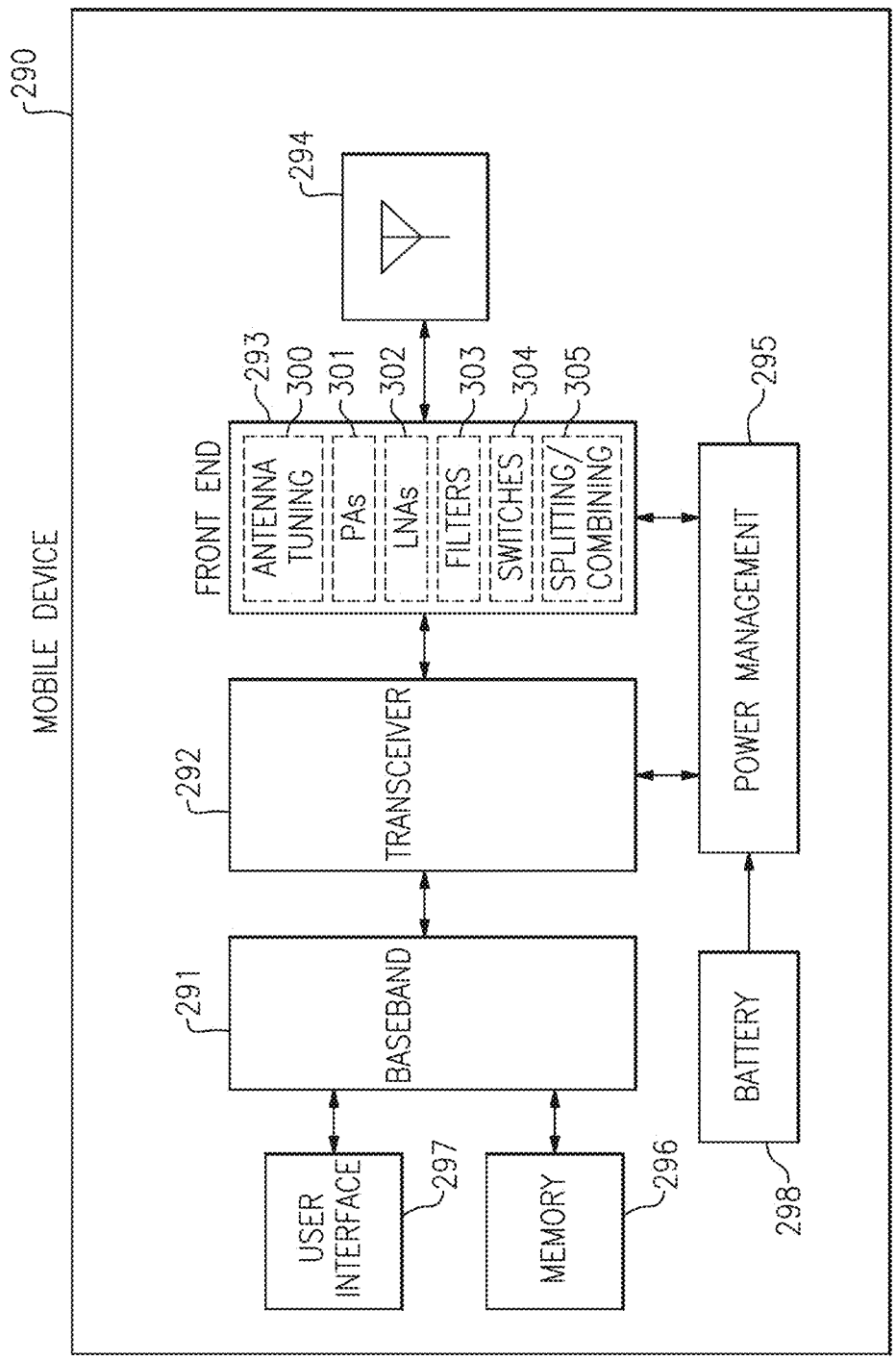
FIG. 30 is a schematic block diagram of a wireless communication device that includes a filter according to an embodiment.

The acoustic wave devices disclosed herein can be implemented in wireless communication devices. FIG. 30 is a schematic block diagram of a wireless communication device 290 that includes a filter according to an embodiment. The wireless communication device 290 can be a mobile device. The wireless communication device 290 can be any suitable wireless communication device. For instance, a wireless communication device 290 can be a mobile phone, such as a smart phone. As illustrated, the wireless communication device 290 includes a baseband system 291, a transceiver 292, a front end system 293, antennas 294, a power management system 295, a memory 296, a user interface 297, and a battery 298.

The wireless communication device 290 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 292 generates RF signals for transmission and processes incoming RF signals received from the antennas 294. Various functionalities associated with the transmission and receiving of RF signals can be achieved by one or more components that are collectively represented in FIG. 30 as the transceiver 292. In one example, separate components (for instance, separate circuits or dies) can be provided for handling certain types of RF signals.

The front end system 293 aids in conditioning signals transmitted to and/or received from the antennas 294. In the illustrated embodiment, the front end system 293 includes antenna tuning circuitry 300, power amplifiers (PAs) 301, low noise amplifiers (LNAs) 302, filters 303, switches 304, and signal splitting/combining circuitry 305. However, other implementations are possible. The filters 303 can include one or more acoustic wave filters that include any suitable number of laterally excited bulk acoustic wave devices in accordance with any suitable principles and advantages disclosed herein.

For example, the front end system 293 can provide a number of functionalities, including, but not limited to, amplifying signals for transmission, amplifying received signals, filtering signals, switching between different bands, switching between different power modes, switching between transmission and receiving modes, duplexing of signals, multiplexing of signals, or any suitable combination thereof.

In certain implementations, the wireless communication device 290 supports carrier aggregation, thereby providing flexibility to increase peak data rates. Carrier aggregation can be used for Frequency Division Duplexing (FDD) and/or Time Division Duplexing (TDD), and may be used to aggregate a plurality of carriers and/or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 294 can include antennas used for a wide variety of types of communications. For example, the antennas 294 can include antennas for transmitting and/or receiving signals associated with a wide variety of frequencies and communications standards.

In certain implementations, the antennas 294 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The wireless communication device 290 can operate with beamforming in certain implementations. For example, the front end system 293 can include amplifiers having controllable gain and phase shifters having controllable phase to provide beam formation and directivity for transmission and/or reception of signals using the antennas 294. For example, in the context of signal transmission, the amplitude and phases of the transmit signals provided to the antennas 294 are controlled such that radiated signals from the antennas 294 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 294 from a particular direction. In certain implementations, the antennas 294 include one or more arrays of antenna elements to enhance beamforming.

The baseband system 291 is coupled to the user interface 297 to facilitate processing of various user input and output (I/O), such as voice and data. The baseband system 291 provides the transceiver 292 with digital representations of transmit signals, which the transceiver 292 processes to generate RF signals for transmission. The baseband system 291 also processes digital representations of received signals provided by the transceiver 292. As shown in FIG. 30, the baseband system 291 is coupled to the memory 296 of facilitate operation of the wireless communication device 290.

The memory 296 can be used for a wide variety of purposes, such as storing data and/or instructions to facilitate the operation of the wireless communication device 290 and/or to provide storage of user information.

The power management system 295 provides a number of power management functions of the wireless communication device 290. In certain implementations, the power management system 295 includes a PA supply control circuit that controls the supply voltages of the power amplifiers 301. For example, the power management system 295 can be configured to change the supply voltage(s) provided to one or more of the power amplifiers 301 to improve efficiency, such as power added efficiency (PAE).

As shown in FIG. 30, the power management system 295 receives a battery voltage from the battery 298. The battery 298 can be any suitable battery for use in the wireless communication device 290, including, for example, a lithium-ion battery.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes example embodiments, the teachings described herein can be applied to a variety of structures. Any of the principles and advantages discussed herein can be implemented in association with RF circuits configured to process signals having a frequency in a range from about $30\lambda$ Hz to 300 GHz, such as in a frequency range from about 400 MHz to 25 GHz.

Aspects of this disclosure can be implemented in various electronic devices. Examples of the electronic devices can include, but are not limited to, consumer electronic products, parts of the consumer electronic products such as packaged radio frequency modules, radio frequency filter die, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a robot such as an industrial robot, an Internet of things device, a stereo system, a digital music player, a radio, a camera such as a digital camera, a portable memory chip, a home appliance such as a washer or a dryer, a peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly coupled, or coupled by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel filters, multiplexer, devices, modules, wireless communication devices, apparatus, methods, and systems described herein may be embodied in a variety of other forms. Furthermore, various omissions, substitutions and changes in the form of the filters, multiplexer, devices, modules, wireless communication devices, apparatus, methods, and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. A laterally excited bulk acoustic wave device comprising:
    an interdigital transducer electrode on a piezoelectric layer, the interdigital transducer electrode arranged to laterally excite a bulk acoustic wave;
    at least a first solid acoustic mirror positioned above the interdigital transducer electrode to confine acoustic energy of the bulk acoustic wave; and
    at least first and second substrates arranged to dissipate heat associated with the bulk acoustic wave, the interdigital transducer electrode, the piezoelectric layer, and the first solid acoustic mirror positioned between the first and second substrates.

2. The laterally excited bulk acoustic wave device of claim 1 further comprising a second solid acoustic mirror positioned below the piezoelectric layer.

3. The laterally excited bulk acoustic wave device of claim 1 wherein the first solid acoustic mirror is arranged to confine acoustic energy such that the first and second support substrates are free from acoustic energy during operation of the laterally excited bulk acoustic wave device.

4. The laterally excited bulk acoustic wave device of claim 1 wherein the first solid acoustic mirror is an acoustic Bragg reflector that includes alternating low impedance and high impedance layers.

5. The laterally excited bulk acoustic wave device of claim 4 wherein at least one of the low impedance layers and at least one of the high impedance layers are free from acoustic energy during operation of the laterally excited bulk acoustic wave device.

6. The laterally excited bulk acoustic wave device of claim 4 wherein the high impedance layers each have a thickness in a range from about $0.14\lambda_p$ to $0.30\lambda_p$ or from about $0.35\lambda_p$ to $0.45\lambda_p$, in which $\lambda_p$ is a wave length of longitudinal wave velocity.

7. The laterally excited bulk acoustic wave device of claim 1 wherein the piezoelectric layer has a thickness in a range from 0.2 micrometers to 0.4 micrometers.

8. The laterally excited bulk acoustic wave device of claim 1 wherein the piezoelectric layer is an aluminum nitride layer.

9. The laterally excited bulk acoustic wave device of claim 1 wherein the piezoelectric layer is a lithium niobate layer or a lithium tantalate layer.

10. The laterally excited bulk acoustic wave device of claim 1 wherein the laterally excited bulk acoustic wave device has a resonant frequency in a range from 4.5 gigahertz to 10 gigahertz.

11. The laterally excited bulk acoustic wave device of claim 1 wherein the laterally excited bulk acoustic wave device has a resonant frequency in a range from 10 gigahertz to 25 gigahertz.

12. A laterally excited bulk acoustic wave component comprising:
    an interdigital transducer electrode on a piezoelectric layer, the interdigital transducer electrode arranged to laterally excite a bulk acoustic wave;
    a first solid acoustic mirror positioned above the interdigital transducer electrode to confine acoustic energy of the bulk acoustic wave;
    a second solid acoustic mirror positioned below the interdigital transducer electrode to further confine the acoustic energy of the bulk acoustic wave; and
    at least first and second substrates arranged to dissipate heat associated with the bulk acoustic wave, the interdigital transducer electrode, the piezoelectric layer, the first solid acoustic mirror, and the second solid acoustic mirror positioned between the first and second substrates.

13. The laterally excited bulk acoustic wave component of claim 12 further comprising a conductive via extending through the second substrate, wherein the conductive via is electrically connected to a laterally excited bulk acoustic wave resonator that includes the interdigital transducer electrode.

14. The laterally excited bulk acoustic wave component of claim 12 further comprising a third solid acoustic mirror on the second substrate, a second piezoelectric layer on the third solid acoustic mirror, and a second interdigital transducer electrode on the second piezoelectric layer.

15. A stacked acoustic wave device assembly comprising:
a first support substrate;
a first laterally excited bulk acoustic wave stack on the first support substrate; the first laterally excited bulk acoustic wave stack including a first piezoelectric layer, a first interdigital transducer electrode on the first piezoelectric layer, and at least a first solid acoustic mirror positioned above the first interdigital transducer electrode to confine acoustic energy of a bulk acoustic wave;
a second support substrate positioned on the first laterally excited bulk acoustic wave stack; and
a second laterally excited bulk acoustic wave stack on the second support substrate, the second laterally excited bulk acoustic wave stack including a second piezoelectric layer, a second interdigital transducer electrode on the second piezoelectric layer, and at least a second solid acoustic mirror positioned between the second piezoelectric layer and the second support substrate.

16. The stacked acoustic wave device assembly of claim 15 wherein the first solid acoustic mirror is included in a second pair of solid acoustic mirrors, the second pair of solid acoustic mirrors being on opposing sides of the second piezoelectric layer.

17. The stacked acoustic wave device assembly of claim 15 further comprising a third substrate over the second laterally excited bulk acoustic wave stack.

18. The stacked acoustic wave device assembly of claim 15 further comprising an adhesion layer positioned between the second support substrate and the first solid acoustic mirror.

19. The stacked acoustic wave device assembly of claim 15 wherein the first laterally excited bulk acoustic wave stack and the second laterally excited bulk acoustic wave stack are included in a single acoustic wave filter arranged to filter a radio frequency signal.

20. The stacked acoustic wave device assembly of claim 15 wherein the first piezoelectric layer has a thickness in a range from 0.2 micrometers to 0.4 micrometers.

* * * * *